US010734384B1

(12) United States Patent
Li et al.

(10) Patent No.: US 10,734,384 B1
(45) Date of Patent: Aug. 4, 2020

(54) VERTICALLY-INTEGRATED TWO-DIMENSIONAL (2D) SEMICONDUCTOR SLABS IN COMPLEMENTARY FIELD EFFECT TRANSISTOR (CFET) CELL CIRCUITS, AND METHOD OF FABRICATING

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/255,008

(22) Filed: Jan. 23, 2019

(51) Int. Cl.
*H01L 27/092* (2006.01)
*H01L 29/24* (2006.01)
*H01L 29/06* (2006.01)
*H01L 29/78* (2006.01)
*H01L 29/66* (2006.01)
(Continued)

(52) U.S. Cl.
CPC .. *H01L 27/0924* (2013.01); *H01L 21/823807* (2013.01); *H01L 21/823821* (2013.01); *H01L 21/823828* (2013.01); *H01L 21/823871* (2013.01); *H01L 27/0207* (2013.01); *H01L 29/0657* (2013.01); *H01L 29/0696* (2013.01); *H01L 29/0847* (2013.01); *H01L 29/24* (2013.01); *H01L 29/66545* (2013.01); *H01L 29/785* (2013.01); *H01L 2029/7858* (2013.01)

(58) Field of Classification Search
CPC ......... H01L 27/0924; H01L 21/823807; H01L 21/823821; H01L 21/823828; H01L 21/823871; H01L 27/0207; H01L 29/66545; H01L 29/0657; H01L 29/0696; H01L 29/0847; H01L 29/24; H01L 29/785; H01L 29/0665; H01L 29/78687; H01L 29/78696; H01L 29/7853–2029/7858
See application file for complete search history.

(56) References Cited

U.S. PATENT DOCUMENTS

2008/0134959 A1* 6/2008 Kasu ............... H01L 29/45 117/84
2015/0122315 A1* 5/2015 Shin ............... H01L 29/66977 136/255

(Continued)

*Primary Examiner* — Shahed Ahmed
(74) *Attorney, Agent, or Firm* — Withrow & Terranova, PLLC

(57) ABSTRACT

Vertically-integrated two-dimensional (2D) semiconductor slabs in Complementary Field-Effect Transistor (FET) (CFET) cell circuits are disclosed. A horizontal footprint of a CFET cell circuit may be reduced in an X-axis dimension by reducing a gate length of the N-type and P-type channel structures. The N-type and P-type channel structures may be formed of 2D semiconductor materials with high carrier mobility and strong on/off control, which allows a gate length of each semiconductor channel structure to be reduced without increasing a leakage current. By employing one or more elongated monolayers of 2D material in each slab, and vertically stacking slabs to form each semiconductor channel structure, a desired CFET drive strength may be adjusted according to a vertical dimension of the CFET cell circuit, while X-axis and Y-axis dimensions of the horizontal footprint are reduced.

28 Claims, 27 Drawing Sheets

(51) Int. Cl.
*H01L 27/02* (2006.01)
*H01L 21/8238* (2006.01)
*H01L 29/08* (2006.01)

(56) References Cited

U.S. PATENT DOCUMENTS

| | | | | |
|---|---|---|---|---|
| 2015/0137075 | A1* | 5/2015 | Heo | H01L 27/0922 |
| | | | | 257/29 |
| 2016/0141427 | A1* | 5/2016 | Chen | H01L 29/78648 |
| | | | | 257/349 |
| 2016/0343805 | A1* | 11/2016 | Lee | H01L 29/45 |
| 2017/0040411 | A1* | 2/2017 | Kawa | G06F 30/39 |
| 2017/0053908 | A1* | 2/2017 | Hoffman | H01L 29/66045 |
| 2019/0140130 | A1* | 5/2019 | Bessonov | H01L 31/035218 |
| 2019/0198669 | A1* | 6/2019 | Park | H01L 29/7827 |
| 2019/0378715 | A1* | 12/2019 | Lin | H01L 21/02485 |
| 2020/0006541 | A1* | 1/2020 | Lin | H01L 21/02499 |

\* cited by examiner

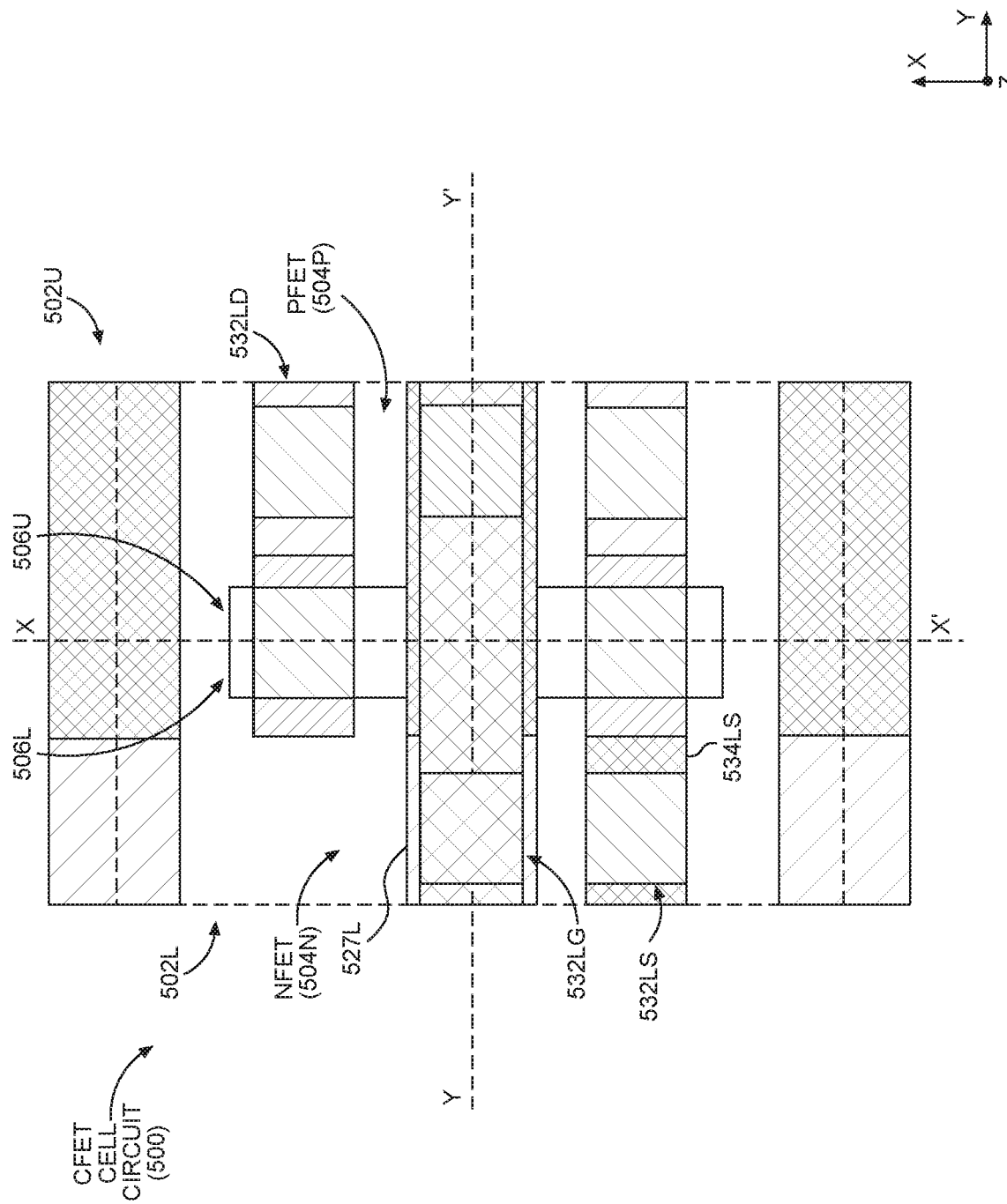

VERTICALLY-INTEGRATED TWO-DIMENSIONAL (2D) SEMICONDUCTOR SLABS IN COMPLEMENTARY FIELD EFFECT TRANSISTOR (CFET) CELL CIRCUITS, AND METHOD OF FABRICATING

BACKGROUND

I. Field of the Disclosure

The technology of the disclosure relates generally to complementary metal-oxide semiconductor (MOS) (CMOS) circuits and, more specifically, to cell circuits having cell circuit architectures employing vertical integration to reduce horizontal scale of CMOS cell circuits.

II. Background

Transistors are essential and employed in large numbers in integrated circuit (IC) components. For example, components such as central processing units (CPUs) and memory systems each employ a large quantity of transistors for logic circuits and memory devices. Transistors are formed of semiconductor materials and may be identified as one of an N-type or a P-type depending on whether the semiconductor material in a channel region of the transistor is an n-type or a p-type channel, which determines whether the majority carriers for current flow are electrons or holes. A Field-Effect Transistor (FET) is a transistor technology widely used in logic circuits and memory devices. In particular, a metal-oxide semiconductor (MOS) FET (MOSFET) may be one of a P-type or an N-type, and is referred to as a PMOS FET (PFET) and an NMOS FET (NFET). Forming logic circuits and memory devices of PFETs and NFETs coupled together in a complementary configuration provides improved performance, power reduction, and resistance to noise in comparison to designs of either NFET or PFET circuits alone. Such complementary configurations are known as complementary MOS (CMOS) circuits. To automate the process of designing IC components which may contain millions of transistors, standardized CMOS logic cell circuits (e.g., inverters, NAND, NOR, etc.) have been developed for use with design automation software tools. Design automation tools are able to generate physical layouts of circuits in which the standardized CMOS circuits are optimally positioned to minimize a total circuit area. Such standardized CMOS circuits are known as standard cells and may also be referred to herein as cell circuits.

There is ongoing market pressure to increase functionality of electronic devices while reducing their power consumption and size, which directly relates to cost. The ICs that provide such functionality contain millions of cell circuits, so there are efforts to reduce the area occupied by each cell circuit. A physical layout of a CMOS cell circuit, which may also be referred to as a "standard cell," includes at least one PMOS transistor and at least one NMOS transistor for forming logic gates as well as internal interconnects of the PMOS and NMOS transistors, and contacts for external interconnection to power, ground, and other circuits. The physical layout of the elements of the CMOS cell circuit determines a total area or footprint occupied by a CMOS cell circuit. To reduce a size of a cell circuit, dimensions of the elements therein, such as a gate length in the direction of current flow in the channel structure, may be reduced. However, with decreasing gate length there is an increase in problems such as leakage currents and on/off control. In addition, gate length scaling is reaching a physical limitation due to a quantum tunneling effect. To improve current flow control in the channel region, FinFET devices and Gate-All-Around (GAA) devices have been developed with gates that at least partially surround a semiconductor channel forming a channel region to apply an electric field to a larger surface area of the channel region than in planar FETs.

In one example, FIG. 1 illustrates a top view of a layout 100 as an example of a conventional CMOS standard cell 102 (also referred to as "standard cell 102") employing FinFETs. FinFETs are a transistor technology in which a semiconductor channel is provided in a fin structure extending vertically above the substrate, making it possible to increase a cross-sectional area of current flow without increasing a horizontal area. The standard cell 102 includes gates 104(1)-104(4) disposed along respective, parallel longitudinal axes $A1_Y(1)$-$A1_Y(4)$ in a first direction 106 of the Y-axis with a defined gate pitch $G_P$. The standard cell 102 includes a first voltage rail 108 configured to be coupled to a supply voltage. The first voltage rail 108 is disposed along a longitudinal axis $A1_X(1)$ in a second direction 110 of the X-axis substantially orthogonal to the first direction 106 in a first metal layer 112 (e.g., a metal zero (M0) metal layer). Additionally, the standard cell 102 includes a second voltage rail 114 having a longitudinal axis $A1_X(2)$ in the second direction 110 in the first metal layer 112. The standard cell 102 also includes diffusion regions 116P, 116N of P-type doped and N-type doped semiconductor materials, respectively, for forming active devices that include semiconducting materials, such as transistors. The standard cell 102 also includes fins 118(1)-118(4) for forming semiconductor channels of FinFETs disposed in the second direction 110 between the first and second voltage rails 108, 114. In this example, a first FinFET 120N formed in the P-type diffusion region 116P will include two fins 118(1), 118(2) to form its semiconductor channel, and a second FinFET 120P formed in the N-type diffusion region 116N will include two fins 118(3), 118(4) to form its semiconductor channel. The gate 104(3), for example, is disposed on a top surface and both side surfaces of each of the fins 118(1)-118(4) for improved current flow control. Trench contacts 122(1)-122(3) are also formed in the first direction 106 to provide contacts to source/drain regions S(1)-S(4), D(1)-D(4) of the fins 118(1)-118(4) formed in the standard cell 102. Trench contact 122(1) has been cut. A metal line 124(1) can be formed in the first metal layer 112 to provide an interconnection to the trench contact 122(1) to provide interconnections to the source or drain region S(1), D(1). Vias (V1) 126(1), 126(2) can be formed over portions of the gates 104(1)-104(4) to form metal contacts to the gates 104(1)-104(4).

A dimension of the standard cell 102 in the Y-axis direction includes dimensions of the P-type diffusion region 116P, the N-type diffusion region 116N, and a non-diffusion region between the N-type and P-type diffusion regions 116P and 116N. The FinFETs 120N, 120P in the standard cell 102 in FIG. 1 each have two (2) respective fins 118(1)-118(2) and 118(3)-118(4) to serve as channel structures. A Y-axis dimension of a conventional CMOS standard cell may be minimized by employing a FinFET with only one fin in each of the P-type diffusion region 116P and the N-type diffusion region 116N, and further advancements in technology have made it possible to fabricate standard cells that support FinFETs employing a single fin for a channel structure. Thus, a CMOS standard cell layout for single-fin FinFETs can occupy less area than the standard cell 102 in FIG. 1 for example, which can reduce total chip size and the number of internal interconnections required. However, there is a desire to reduce even further the footprint size of a cell circuit, but no further reduction of the number of fins in a FinFET is possible. In general, a dimension of a standard cell layout in the Y-axis direction remains constant but dimensions of cells vary in the X-axis direction. Reducing the Y-axis dimension of standard cells can significantly reduce layout size. The Y-axis dimension is dominated by a metal line pitch in the first and second metal layers (M0, M1), which are used for transistor contacts for routing power and signals. M0/M1 pitch scaling is an important factor in determining a minimum layout size but benefits of scaling M0/M1 pitch are limited by fin pitch, contact location/pitch and minimum routing requirements. Thus, other methods are sought for reducing a layout area of a standard cell.

In the X-axis direction, a dimension of the standard cell 102 includes a length of a gate region along the longitudinal axes $A1_Y(1)$-$A1_Y(4)$ of the fins 118(1)-118(4). To reduce a dimension in the X-axis direction, a length of a gate region may be reduced. However, as a length of a gate region in a conventional CMOS standard cell with a silicon (Si) channel structure is reduced, leakage currents become difficult to control, despite the increased current flow control made possible by multi-faceted gates employed in FinFETs and GAA FETs. Further gate length scaling will be limited as physical limitations are reached.

SUMMARY OF THE DISCLOSURE

Aspects disclosed herein include vertically-integrated two-dimensional (2D) semiconductor slabs in Complementary Field-Effect Transistor (FET) (CFET) cell circuits. An exemplary CFET cell circuit includes an N-type channel structure in a first circuit layer and P-type channel structure in a second circuit layer, each channel structure formed of vertically-stacked elongated slabs of 2D semiconductor material to provide a footprint reduction in the X-axis direction and the Y-axis direction of a horizontal footprint of the CFET cell circuit. In one aspect, the CFET cell circuit may include a complementary metal-oxide semiconductor (CMOS) circuit in an integrated circuit structure with an N-type semiconductor channel structure of an N-type FET (NFET) in a first layer and a P-type semiconductor channel structure of a P-type FET (PFET) in a second layer stacked vertically above the first layer to reduce a Y-axis dimension of the horizontal footprint of the CFET cell circuit. The horizontal footprint of the CFET cell circuit may also be reduced in an X-axis dimension by reducing a gate length of the N-type and P-type semiconductor channel structures. In this regard, the N-type and P-type semiconductor channel structures may be formed of vertically-stacked layers of 2D semiconductor materials with high carrier mobility and strong on/off control, which allows a gate length of each semiconductor channel structure to be reduced without increasing a leakage current. For example, the 2D semiconductor materials may be $MX_2$-type compounds (e.g., transition metal dichalcogenides) formed in elongated 2D atomic monolayers, each capable of conducting an amount of current. By employing one or more elongated monolayers of 2D material in each slab, and vertically stacking the slabs to form each semiconductor channel structure, a desired CFET drive strength may be adjusted according to a vertical dimension of the CFET cell circuit, while X-axis and Y-axis dimensions of the horizontal footprint are reduced.

In an aspect, a CFET cell circuit is disclosed herein. The CFET cell circuit includes a substrate, a lower circuit layer, and an upper circuit layer. The lower circuit layer includes an NFET that is disposed above the substrate and includes a lower channel structure and a lower gate. The lower channel structure includes a first two-dimensional (2D) semiconductor slab of a first type vertically integrated with a second 2D semiconductor slab of the first type. Each of the first and second 2D slabs has a longitudinal axis in a first direction. The lower channel structure also includes a lower source/drain region integrated with first end portions of the first and second 2D slabs, and a lower drain/source region integrated with second end portions of the first and second 2D slabs. The lower gate is disposed on faces of the first and second 2D slabs between the lower source/drain region and the lower drain/source region. The upper circuit layer includes a PFET that is disposed above the lower circuit layer and includes an upper channel structure and an upper gate. The upper channel structure includes a third 2D semiconductor slab of a second type vertically integrated with a fourth 2D semiconductor slab of the second type. Each of the third and fourth 2D slabs has a longitudinal axis in a second direction. The upper channel structure also includes an upper source/drain region integrated with first end portions of the third and fourth 2D slabs, and an upper drain/source region integrated with second end portions of the third and fourth 2D slabs. The upper gate is disposed on faces of the third and fourth 2D slabs between the lower source/drain region and the lower drain/source region.

In another aspect, a method of fabricating a CFET cell circuit is disclosed herein. The method includes forming a lower circuit layer including an NFET above a substrate, and forming an upper circuit layer including a PFET above the lower circuit layer. Forming the lower circuit layer includes vertically stacking a first 2D slab and a second 2D slab to form a lower semiconductor channel structure for the NFET, with the first and second 2D slabs each having a longitudinal axis and including a semiconductor material of a first type. Forming the lower circuit layer further includes disposing a lower gate of the NFET on faces of the first and second 2D slabs. Forming the lower circuit layer further includes integrating a lower source/drain material with first end portions of the first and second 2D slabs to form a lower source/drain region of the NFET on a first side of the lower gate, and integrating a lower drain/source material with second end portions of the first and second 2D slabs to form a lower drain/source region of the NFET on a second side of the lower gate. Forming the upper circuit layer includes vertically stacking a third 2D slab and a fourth 2D slab to form an upper semiconductor channel structure of the PFET, with the third and fourth 2D slabs each having a longitudinal axis and including a semiconductor material of a second type. Forming the upper circuit layer further includes disposing an upper gate of the PFET on faces of the third and fourth 2D slabs. Forming the upper circuit layer further includes integrating an upper source/drain material with first end portions of the third and fourth 2D slabs to form an upper source/drain region of the PFET on a first side of the upper gate, and integrating an upper drain/source material with second end portions of the third and fourth 2D slabs to form an upper drain/source region of the PFET on a second side of the upper gate.

BRIEF DESCRIPTION OF THE FIGURES

FIGS. 2C-1 and 2C-2 are top views of the lower circuit layer of the CFET cell circuit shown in FIGS. 2A and 2B, which includes an NFET disposed on a substrate, and the upper circuit layer including a PFET disposed on the lower circuit layer during fabrication;

FIGS. 5C-1 and 5C-2 are top views of the lower circuit layer of the CFET cell circuit shown in FIGS. 5A and 5B, which includes a PFET disposed on a substrate, and the upper circuit layer including an NFET disposed on the lower circuit layer during fabrication;

FIG. 5D is a top view of the lower and upper circuit layers of the CFET cell circuit in FIGS. 5C-1 and 5C-2, respectively, forming the CFET cell circuit in FIGS. 5A and 5B;

DETAILED DESCRIPTION

Figure 1:
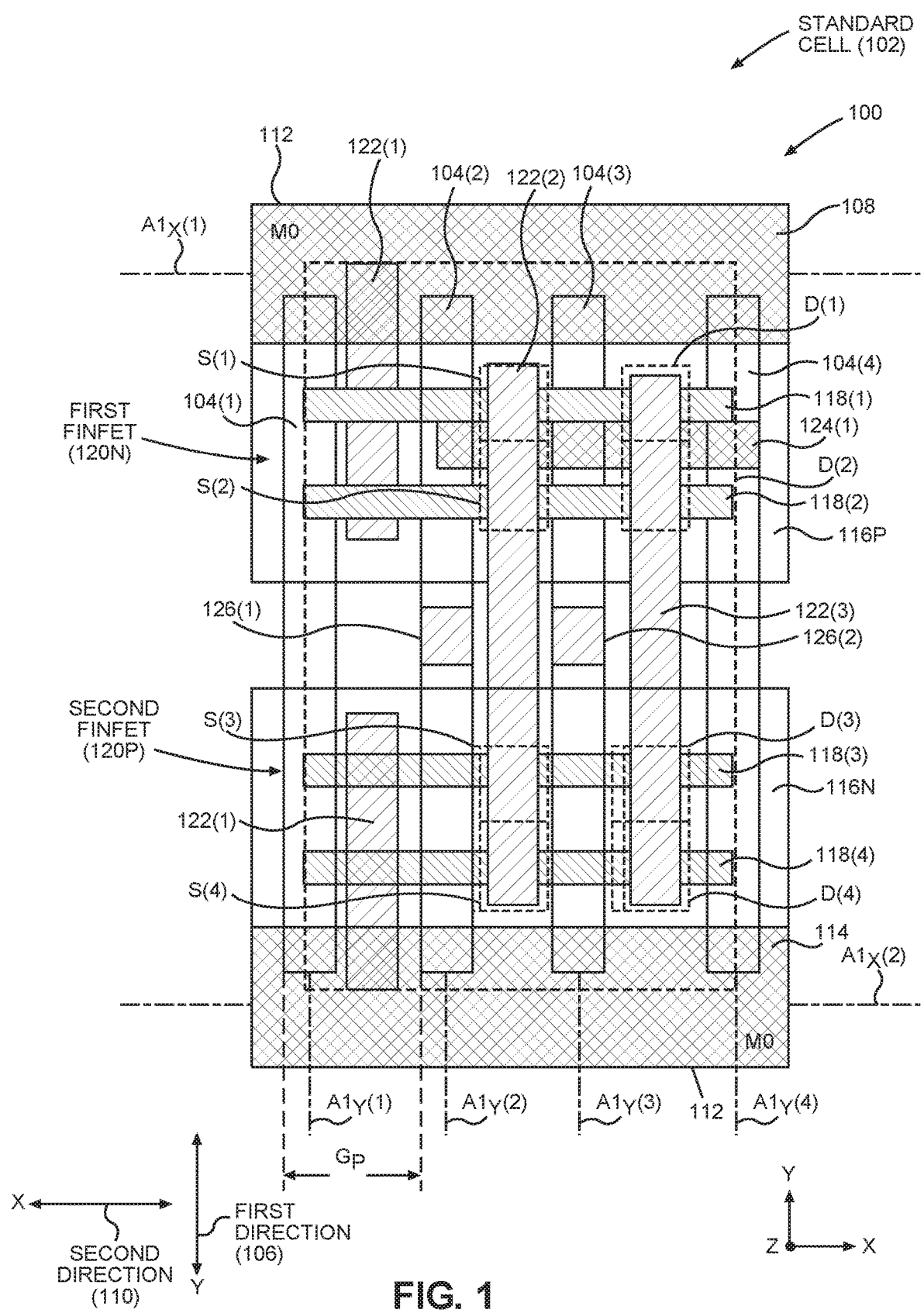
FIG. 1 is a top view of a conventional complementary metal-oxide semiconductor (CMOS) cell circuit layout including a P-type metal oxide semiconductor (MOS) (PMOS) Fin Field-Effect Transistor (FET) (FinFET) and an N-type MOS (NMOS) FinFET laterally disposed on a semiconductor layer.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include vertically-integrated two-dimensional (2D) semiconductor slabs in Complementary Field-Effect Transistor (FET) (CFET) cell circuits. An exemplary CFET cell circuit includes an N-type channel structure in a first circuit layer and P-type channel structure in a second circuit layer, each channel structure formed of vertically-stacked elongated slabs of 2D semiconductor material to provide a footprint reduction in the X-axis direction and the Y-axis direction of a horizontal footprint of the CFET cell circuit. In one aspect, the CFET cell circuit may include a complementary metal-oxide semiconductor (CMOS) circuit in an integrated circuit structure with an N-type semiconductor channel structure of an N-type FET (NFET) in a first layer and a P-type semiconductor channel structure of a P-type FET (PFET) in a second layer stacked vertically above the first layer to reduce a Y-axis dimension of the horizontal footprint of the CFET cell circuit. The horizontal footprint of the CFET cell circuit may also be reduced in an X-axis dimension by reducing a gate length of the N-type and P-type semiconductor channel structures. In this regard, the N-type and P-type semiconductor channel structures may be formed of vertically-stacked layers of 2D semiconductor materials with high carrier mobility and strong on/off control, which allows a gate length of each semiconductor channel structure to be reduced without increasing a leakage current. For example, the 2D semiconductor materials may be $MX_2$-type compounds (e.g., transition metal dichalcogenides) formed in elongated 2D atomic monolayers, each capable of conducting an amount of current. By employing one or more elongated monolayers of 2D material in each slab, and vertically stacking the slabs to form each semiconductor channel structure, a desired CFET drive strength may be adjusted according to a vertical dimension of the CFET cell circuit, while X-axis and Y-axis dimensions of the horizontal footprint are reduced.

Figure 2A:
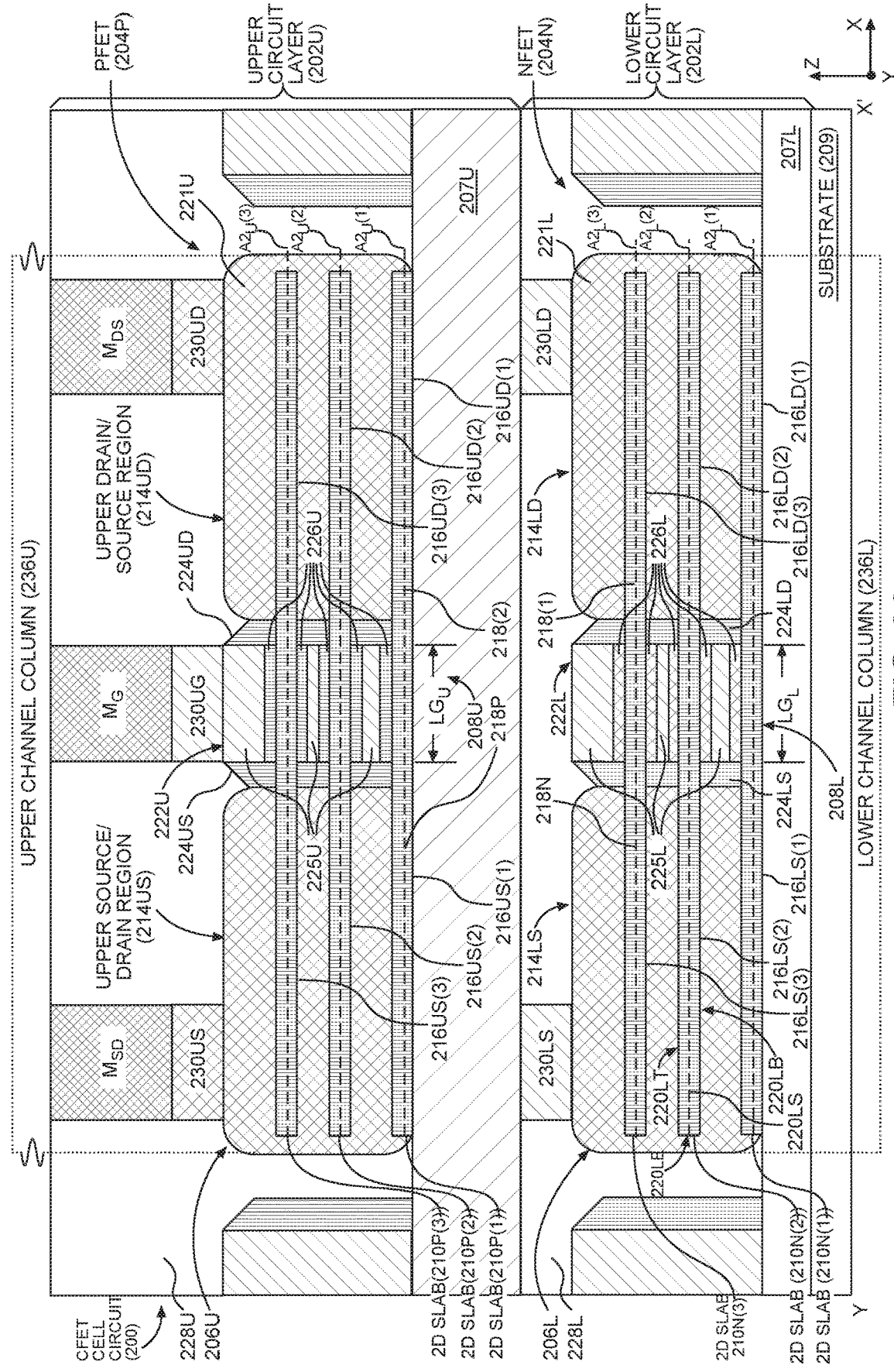
FIG. 2A is a cross-sectional side view in a first direction of an exemplary Complementary FET (CFET) cell circuit with a lower circuit layer including an N-type FET (NFET) disposed above a substrate, the NFET including a lower channel structure formed of vertically-integrated 2D semiconductor slabs of a first type, and an upper circuit layer including a P-type FET (PFET) disposed above the lower circuit layer, the PFET including an upper channel structure formed of vertically-integrated 2D semiconductor slabs of a second type to reduce the footprint size of the CFET cell circuit.

To further reduce a dimension of a CFET cell circuit in the Y-axis direction, a CFET cell circuit may include an NFET vertically-integrated with a PFET in a complementary configuration (e.g., as a CMOS circuit). The disclosed CFET cell circuit is provided in an integrated circuit structure including an N-type channel structure and a P-type channel structure stacked vertically to reduce a horizontal footprint. In this regard, FIG. 2A illustrates a cross-sectional side view of a of a CFET cell circuit 200 in the Z-axis and Z-axis shown therein. The cross-sectional view shown in FIG. 2A is taken along the line X-X' shown in a top view of the CFET cell circuit 200 illustrated in FIG. 2D. As will be discussed in more detail below, the CFET cell circuit 200 includes an upper circuit layer 202U with a PFET 204P disposed vertically above (i.e., stacked above) a lower circuit layer 202L with an NFET 204N. In this manner, the vertical stacking reduces the horizontal footprint of the CFET cell circuit 200 in the Y-axis direction. The NFET 204N and the PFET 204P may be interconnected in a complementary configuration, as in a CMOS circuit.

In addition, an X-axis dimension of a footprint of the CFET cell circuit 200 may be reduced by reducing length dimensions of the NFET 204N and the PFET 204P. In particular, the NFET 204N in the lower circuit layer 202L is formed in a lower channel structure 206L in which a gate region 208L has a length dimension $LG_L$ in the X-axis direction, and the PFET 204P in the upper circuit layer 202U is formed in an upper channel structure 206U in which a gate region 208U has a length dimension $LG_U$ in the X-axis direction. By reducing the length dimensions $LG_L$ and $LG_U$, a dimension in the X-axis direction of a footprint of the CFET cell circuit 200 may be reduced.

In an exemplary aspect, $MX_2$-type compounds (e.g., transition metal dichalcogenide crystals), known as "2D materials," may be employed in the semiconductor channel structures of the NFET 204N and PFET 204P to reduce the lengths $LG_L$ and $LG_U$ in the X-axis direction without a corresponding increase in leakage current associated with reducing a length of a gate region of a silicon channel structure. In the CFET cell circuit 200 in FIG. 2A, the lower circuit layer 202L includes the NFET 204N, and the upper circuit layer 202U includes the PFET 204P. The NFET 204N is disposed on an isolation layer 207L above a substrate 209. The lower channel structure 206L includes a first 2D semiconductor slab ("2D slab") 210N(1) of the 2D material vertically integrated with a second 2D slab 210N(2). In the CFET cell circuit 200 in FIG. 2A, a "slab" is a structure formed of one or more layers of a 2D material, with first and second dimensions in orthogonal directions (e.g., X-axis and Y-axis directions) and having a thickness dimension which is orthogonal to the first and second dimensions (e.g., Z-axis direction) and is smaller than the first and second dimensions. As shown in a top view of the CFET cell circuit 200 in FIG. 2C-1, the 2D slabs 210N(1) and 210N(1) may each extend in a range from 20 nm to 500 nm in a longitudinal direction (e.g., X-axis direction), and extend in a range from 3 nm to 50 nm in a direction orthogonal to the longitudinal direction (e.g., Y-axis direction). As shown in FIG. 2A, the 2D slabs 210N(1) and 210N(2) have a thickness dimension, which may be in the range from 0.6 nm to 10.0 nm. The lower channel structure 206L in FIG. 2A may also include additional 2D slabs, such as 2D slab 210N(3), vertically integrated with the first and second 2D slabs 210N(1) and 210N(2) to increase a drive strength of the NFET 204N. Although the slab structures in FIG. 2A may appear to be planar, stackable slabs having other (e.g., non-planar) shapes are within the scope of the present disclosure.

Each of the 2D slabs 210N(1)-210N(3) includes at least one monolayer (not individually shown) of a first type of 2D semiconductor material 218(1), such as an N-type material 218N, extending in the X-axis direction and the Y-axis direction. 2D materials are atomically thin semiconductor monolayers of an $MX_2$ compound, where M is a transition metal atom (Mo, W, etc.) and X is a chalcogen atom (S, Se, or Te). For example, the N-type material 218N may be tungsten disulfide ($WS_2$). Crystal monolayers of $MX_2$ compounds have a high carrier mobility, lower dielectric constant, and thinner channel thickness than silicon, providing strong on/off control of the channel. Therefore, a channel structure formed of $MX_2$ compounds may have higher drive strength and lower leakage current than a similarly-sized silicon channel structure. By employing the N-type material 218N in the 2D slabs 210N(1)-210N(3), channel control in the lower gate region 208L is improved over a channel region of the same length in a channel structure formed of silicon. Therefore, by employing the 2D material in the lower channel structure 206L, rather than silicon, the length $LG_L$ of the lower gate region 208L may be made smaller to reduce a dimension of the CFET cell circuit 200 in the X-axis direction without a causing an increase in leakage current in the NFET 204N. The 2D slabs 210N(1)-210N(3) extend along respective longitudinal axes $A2_L(1)$-$A2_L(3)$ and may be integrated by stacking in a vertical (e.g., Z-axis) direction one above another. By vertically stacking the 2D slabs 210N(1)-210N(3) such that their longitudinal axes $A2_L(1)$-$A2_L(3)$ overlap (e.g., in the Z-axis direction) an area occupied by the lower channel structure 206L is minimized.

With continuing reference to FIG. 2A, the lower channel structure 206L also includes a lower source/drain material 221L integrated with first end portions 216LS(1)-216LS(3) of the 2D slabs 210N(1)-210N(3) for forming a lower source/drain region 214LS and the lower source/drain material 221L integrated with second end portions 216LD(1)-216LD(3) of the 2D slabs 210N(1)-210N(3) to form a lower drain/source region 214LD. In operation of the NFET 204N, either the lower source/drain region 214LS or the lower drain/source region 214LD may function as a source while the other functions as a drain. Integration of the lower source/drain region 214LS and the lower drain/source region 214LD with the respective end portions 216LS(1)-216LS(3) and 216LD(1)-216LD(3) may include one or more of doping the 2D slabs 210N(1)-210N(3) with the lower source/drain material 221L, growing the lower source/drain material 221L epitaxially on the 2D slabs 210N(1)-210N(3), and forming the lower source/drain material 221L on or in contact with the 2D slabs 210N(1)-210N(3). As shown in FIG. 2A, the lower source/drain material 221L of the lower source/drain region 214LS and the lower drain/source region 214LD may be formed on faces of the 2D slabs 210N(1)-210N(3), except where the 2D slab 210N(1) is in contact with the isolation layer 207L. For example, the lower source/drain material 221L may be formed on top face 220LT, bottom face 220LB, side face 220LS, and end faces 220LE of 2D slab 210N(2) in the first and second end portions 216LS(2) and 216LD(2). The lower source/drain material 221L may be similarly formed on faces of 2D slabs 210N(1) and 210N(3), as shown in FIG. 2A.

By vertically stacking the 2D slabs 210N(1)-210N(3) such that their longitudinal axes $A2_L(1)$-$A2_L(3)$ overlap, as discussed above, a current flow in each of the 2D slabs 210N(1)-210N(3) may be controlled by a single gate structure. In this regard, the lower channel structure 206L includes a lower gate 222L disposed on faces of the 2D slabs 210N(1)-210N(3), such as the faces 220LT, 220LB, and 220LS of 2D slab 210N(2). The lower gate 222L is disposed on the 2D slabs 210N(1)-210N(3) between the lower source/drain region 214LS and the lower drain/source region 214LD in the X-axis direction. The lower gate 222L is separated from the lower source/drain region 214LS by side spacer 224LS and separated from the lower drain/source region 214LD by side spacer 224LD. The lower gate 222L includes gate portions 225L electrically insulated from the respective 2D slabs 210N(1)-210N(3) by gate dielectric layers 226L. The lower gate 222L also includes a lower field gate 227L (shown in FIG. 2B) which provides a horizontal interconnect disposed on the lower gate 222L. The lower circuit layer 202L also includes trench contacts 230LS and 230LD formed above the lower source/drain region 214LS and the lower drain/source region 214LD, respectively. An inter-layer dielectric (ILD) 228L surrounds the NFET 204N, the lower field gate 227L and the trench contacts 230LS and 230LD. The lower field gate 227L and the trench contacts 230LS and 230LD are discussed further with respect to FIG. 2B, below.

As noted above, the CFET cell circuit 200 in FIG. 2A also includes the upper circuit layer 202U disposed above the lower circuit layer 202L that includes the PFET 204P to provide a CMOS architecture for the CFET cell circuit 200. The upper circuit layer 202U of the CFET cell circuit 200 will now be discussed. In this regard, as shown in FIG. 2A, the upper circuit layer 202U includes the PFET 204P disposed on an isolation layer 207U. The PFET 204P is formed in an upper channel structure 206U including a third 2D slab 210P(1) vertically integrated with a fourth 2D slab 210P(2). The upper channel structure 206U in FIG. 2A also includes another 2D slab 210P(3) vertically integrated with the third and fourth 2D slabs 210P(1) and 210P(2) to increase a drive strength of the PFET 204P. Each of the 2D slabs 210P(1)-210P(3) includes at least one monolayer (not individually shown) of a second 2D semiconductor material 218(2) (e.g., $MX_2$ material), such as a P-type material 218P, extending in the X-axis direction and the Y-axis direction. For example, the P-type material 218P may be molybdenum disulfide ($MoS_2$). By employing 2D materials for the P-type material 218P in the 2D slabs 210P(1)-210P(3), channel control in an upper gate region 208U is improved over a channel region in a channel structure formed of silicon. Therefore, the length $LG_U$ of the upper gate region 208U may be made smaller to reduce a dimension of the CFET cell circuit 200 in the X-axis direction without causing an increase in leakage current in the PFET 204P. The 2D slabs 210P(1)-210P(3) extend along respective longitudinal axes $A2_U(1)$-$A2_U(3)$ in the X-axis direction and may be integrated in the vertical direction one above another.

The upper channel structure 206U also includes an upper source/drain material 221U integrated with first end portions 216US(1)-216US(3) of the 2D slabs 210P(1)-210P(3) to form an upper source/drain region 214US and the upper source/drain material 221U integrated with second end portions 216UD(1)-216UD(3) of the 2D slabs 210P(1)-210P(3) to form an upper drain/source region 214UD. In operation of the PFET 204P, either the upper source/drain region 214US or the upper drain/source region 214UD may function as a source while the other functions as a drain.

Integration of the upper source/drain region 214US and the upper drain/source region 214UD with the respective end portions 216US(1)-216US(3) and 216UD(1)-216UD(3) may include one or more of doping the 2D slabs 210P(1)-210P(3) with the upper source/drain material 221U, growing the upper source/drain material 221U epitaxially on the 2D slabs 210P(1)-210P(3), and forming the upper source/drain material 221U on or in contact with the 2D slabs 210P(1)-210P(3). As shown in FIG. 2A, the upper source/drain material 221U of the upper source/drain region 214US and the upper drain/source region 214UD may be formed on faces of the 2D slabs 210P(1)-210P(3), except where the 2D slab 210P(1) is in contact with the isolation layer 207U. For example, the upper source/drain material 221U may be formed on faces of the 2D slab 210P(2) in the end portions 216US(2) and 216UD(2). The upper source/drain material 221U may be similarly formed on faces of 2D slabs 210P(1) and 210P(3), as shown in FIG. 2A.

The upper channel structure 206U also includes an upper gate 222U disposed on faces of the 2D slabs 210P(1)-210P(3). The upper gate 222U is disposed on the 2D slabs 210P(1)-210P(3) between the upper source/drain region 214US and the upper drain/source region 214UD. The upper gate 222U is separated from the upper source/drain region 214US by side spacer 224US and separated from the lower drain/source region 214UD by side spacer 224UD. The upper gate 222U includes gate portions 225U electrically insulated from the respective 2D slabs 210P(1)-210P(3) by gate dielectric layers 226U. The upper gate 222U also includes an upper field gate 227U (shown in FIG. 2B) which provides a horizontal interconnect disposed on the upper gate 222U. The upper circuit layer 202U includes trench contacts 230US and 230UD disposed above the upper source/drain region 214US and the upper drain/source region 214UD, respectively. The upper circuit layer 202U also includes a trench contact 230UG disposed on the upper gate 222U. Metal layer interconnects $M_{SD}$, $M_G$, and $M_{DS}$ are disposed on the trench contracts 230US, 230UG, and 230UD, respectively, for coupling external circuits to the PFET 204P. An ILD 228U surrounds the PFET 204P, the metal layer interconnects $M_{SD}$, $M_G$, and $M_{DS}$, and the trench contacts 230US, 230UG, and 230UD.

As shown in FIG. 2A, an upper channel column 236U extends vertically (up and down) from a horizontal area of the upper channel structure 206U, and a lower channel column 236L extends vertically from a horizontal area of the lower channel structure 206L. In this regard, the upper channel column 236U overlaps at least a portion of the lower channel column 236L. In the example in FIG. 2A, the upper channel structure 206U in the upper circuit layer 202U overlaps the lower channel structure 206L in the lower circuit layer 202L such that the upper channel column 236U fully overlaps (i.e., occupies substantially the same horizontal area extending in a vertical direction) as the lower channel column 236L. In another aspect the 2D slab 210N(2) may partially overlap or fully overlap the 2D slab 210N(1) when vertically stacked on the 2D slab 210N(1) to minimize a horizontal area occupied by the lower channel structure 206L, and the 2D slab 210P(2) may partially overlap or fully overlap the 2D slab 210P(1) when vertically stacked on the 2D slab 210P(1) to minimize a horizontal area occupied by the upper channel structure 206U. In this regard, a horizontal area (X-axis and Y-axis directions) occupied by the CFET cell circuit 200 may be reduced in comparison to the standard cell 102 of FIG. 1 in exchange for an increased dimension in the Z-direction.

Figure 2B:
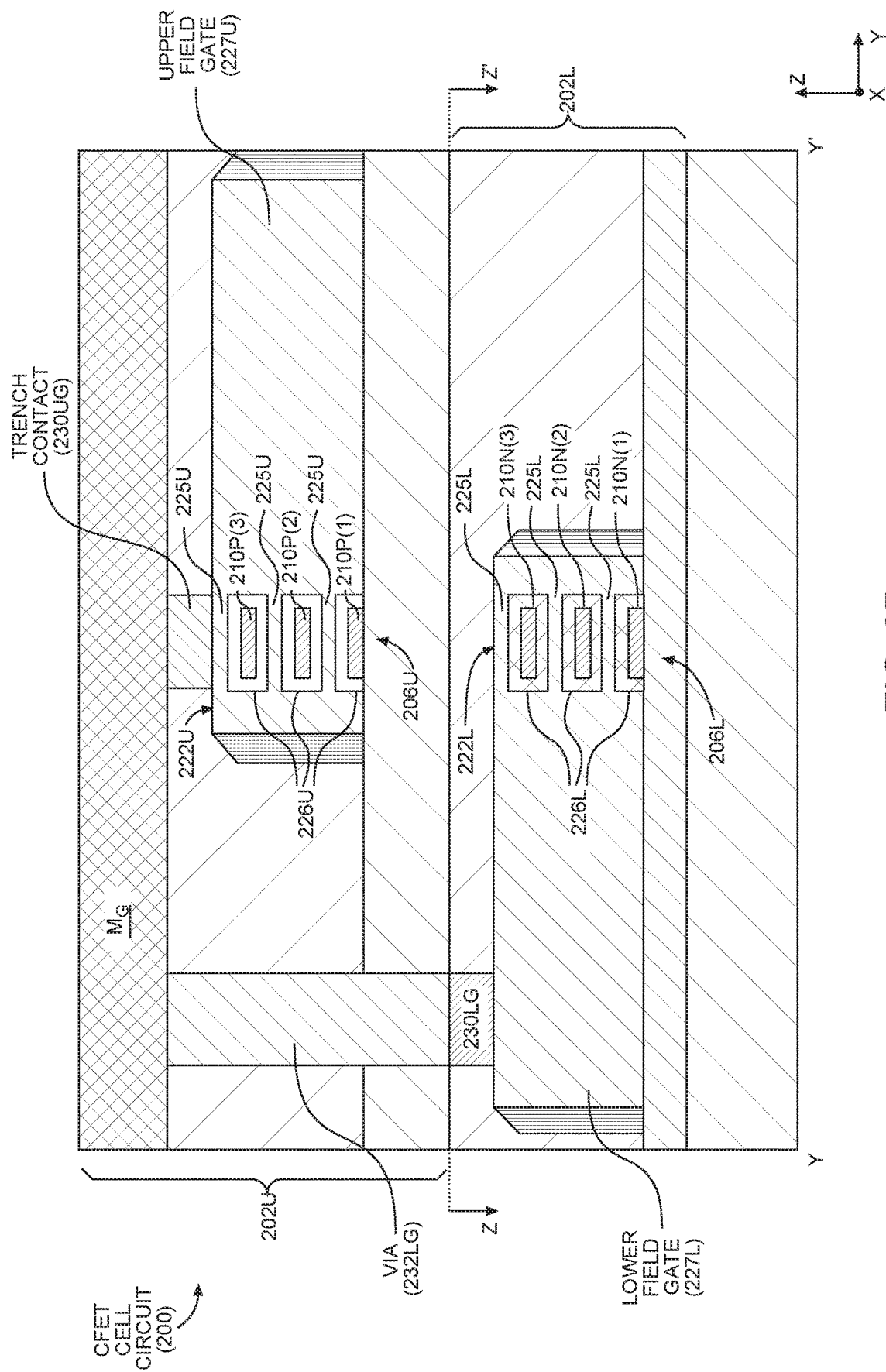
FIG. 2B is a cross-sectional side view of the CFET cell circuit shown in FIG. 2A in a second direction orthogonal to the first direction in FIG. 2A.

FIG. 2B illustrates a side view of a cross-section in the Y-axis and Z-axis directions of the CFET cell circuit 200. The cross-sectional view shown in FIG. 2B is taken along the line Y-Y' shown in the top view of the CFET cell circuit 200 illustrated in FIG. 2D. The cross-sectional view in FIG. 2B shows the 2D slabs 210N(1)-210N(3) one above another in the lower channel structure 206L and the 2D slabs 210P(1)-210P(3) one above another in the upper channel structure 206U. As shown in FIG. 2B, the gate dielectric layers 226L are formed around each of the 2D slabs 210N(1)-210N(3) to separate the 2D slabs 210N(1)-210N(3) from the gate portions 225L of the lower gate 222L. Similarly, the gate dielectric layers 226U are formed around each of the 2D slabs 210P(1)-210P(3) to separate the 2D slabs 210P(1)-210P(3) from the gate portions 225U of the upper gate 222U.

In addition, FIG. 2B shows an example of vertical integration of the upper channel structure 206U in the upper circuit layer 202U above the lower channel structure 206L in the lower circuit layer 202L to reduce a dimension of the CFET cell circuit 200 in the Y-axis direction. For example, the upper channel structure 206U may be positioned directly above the lower channel structure 206L. However, with the lower gate 222L in the lower channel structure 206L located directly below the upper channel structure 206U, a vertical inter-layer access (via) from the lower gate 222L to the metal interconnect $M_G$ may be obstructed. To avoid such obstruction, the lower field gate 227L extends in the Y-axis direction, orthogonal to the longitudinal axis $A2_L(1)$ of the first 2D slab 210N(1), from the lower gate 222L to a location in the lower circuit layer 202L that is not vertically obstructed. In this regard, the lower field gate 227L provides a horizontal interconnect orthogonal to the longitudinal axes $A2_L(1)$-$A2_L(3)$ (see FIG. 2A) from the lower gate 222L to a location in the lower circuit layer 202U in which a via 232LG to the metal interconnect $M_G$ is not obstructed by the upper channel structure 206U. The upper field gate 227U may be formed on the upper gate 222U as a horizontal interconnect in the upper circuit layer 202U. In this regard, the upper field gate 227U may provide an alternative location for the trench contact 230UG, if needed. Referring back to the lower circuit layer 202L in FIG. 2B, a trench contact 230LG is formed on the lower field gate 227L, and the via 232LG extends through the upper circuit layer 202U from the trench contact 230LG in the lower circuit layer 202L to the metal interconnect $M_G$ above the upper circuit layer 202U. As will be disclosed with regard to FIGS. 2C-1 and 2C-2, horizontal interconnects similar to the lower field gate 227L are provided in the lower circuit layer 202L from the lower source/drain region 214LS and the lower drain/source region 214LD to locations at which a via to metal interconnects above the upper circuit layer 202U may be unobstructed.

Figures 2, 2C:
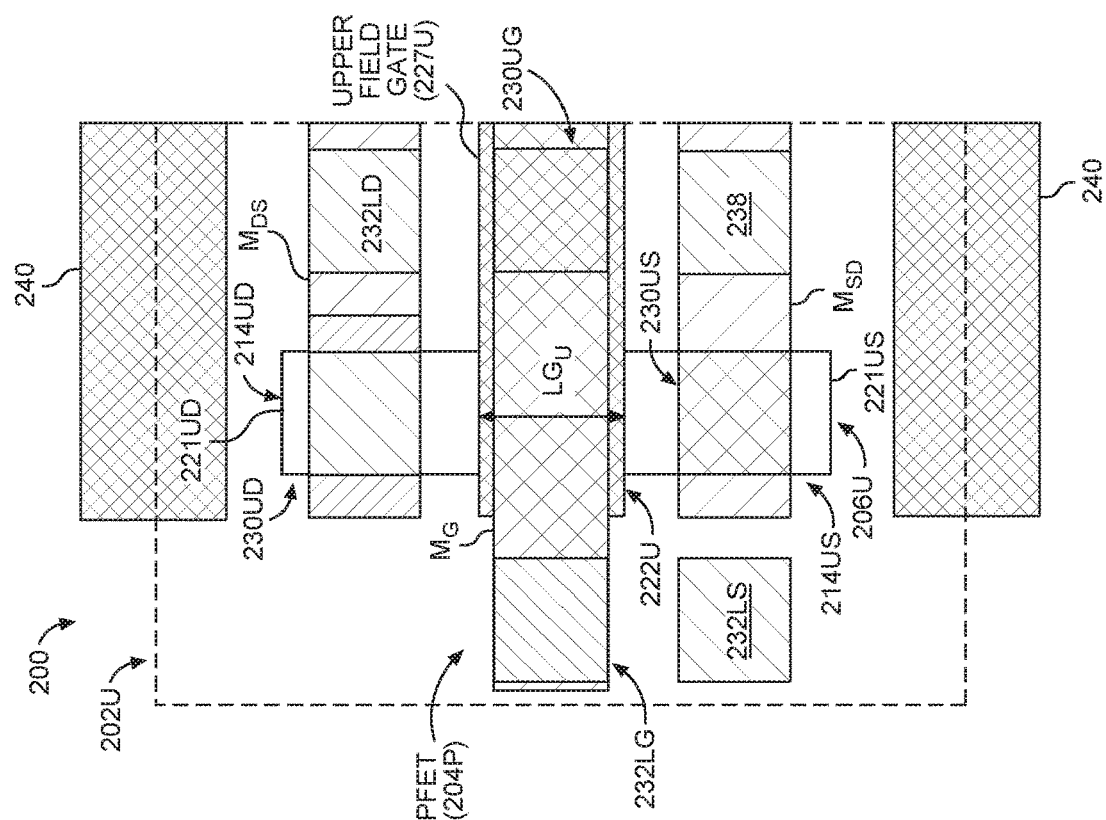
Figures 1, 2C:
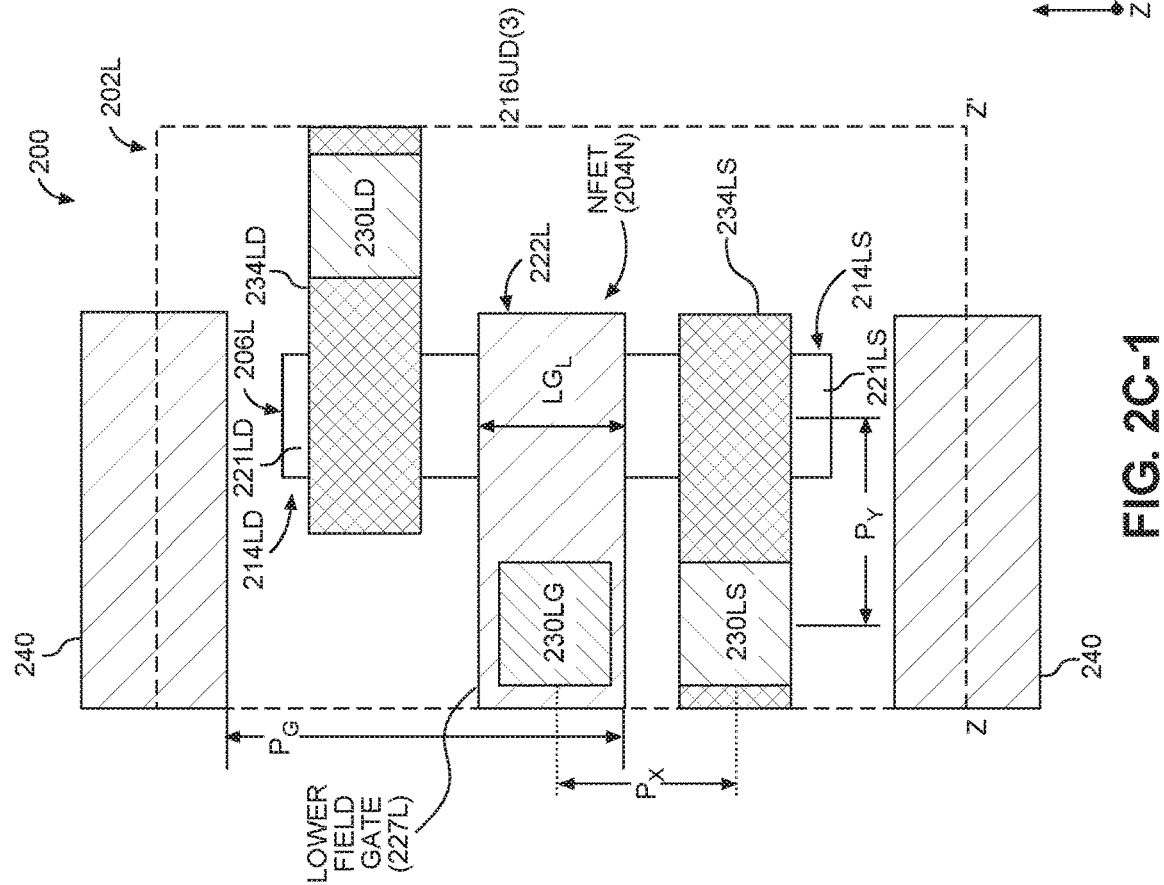

FIG. 2C-1 illustrates a top view of a horizontal cross-section, taken at line Z-Z' in FIG. 2B, showing features of the lower circuit layer 202L including the NFET 204N. FIG. 2C-1 shows horizontal interconnects 234LS and 234LD extending in the X-axis direction, orthogonal to the lower channel structure 206L, from the lower source/drain region 214LS and the lower drain/source region 214LD, respectively. The lower field gate 227L is also shown extending in the Y-axis direction from the lower gate 222L. In addition, FIG. 2C-1 shows that the trench contacts 230LS, 230LG, and 230LD are in locations of the lower circuit layer 202L that are not vertically obstructed by the upper channel structure 206U in the upper circuit layer 202U. In this regard, FIG. 2C-1 shows that the trench contacts 230LS, 230LG, and 230LD are positioned according to a line pitch $P_Y$ in the Y-axis direction relative to the lower channel structure 206L, and according to a line pitch $P_X$ in the X-axis direction relative to the lower field gate 227L. Line pitches $P_X$ and $P_Y$ may be a center-to-center distance between features, as shown in FIG. 2C-1.

FIG. 2C-2 illustrates a top view of features of the upper circuit layer 202U including the PFET 204P. FIG. 2C-2 shows the upper field gate 227U extending in the Y-axis direction orthogonal to the longitudinal axes $A2_U(1)$-$A2_U(3)$ (see FIG. 2A) and the trench contact 230UG in an alternative location to the location shown in FIG. 2B. FIG. 2C-2 shows top views of the via 232LG and vias 232LS and 232LD which are positioned to extend vertically from the trench contacts 230LG, 230LS, and 230LD, respectively, in the lower circuit layer 202L. FIG. 2C-2 also shows top views of the trench contracts 230US, 230UG, and 230UD in the upper circuit layer 202U. As shown, the vias 232LS, 232LG and 232LD and the trench contacts 230UG, 230US, and 230UD are spaced apart in the upper circuit layer 202U according to the line pitch $P_X$ in the X-axis direction and according to the line pitch $P_Y$ in the Y-axis direction in an arrangement to minimize a footprint of the CFET cell circuit 200.

FIG. 2C-2 shows electrical connections for configuring the NFET 204N in FIG. 2C-1 and the PFET 204P in a CMOS inverter configuration. For example, the metal interconnect Me connects between the trench contacts 230LG and 230UG to electrically couple the lower gate 222L and the upper gate 222U. The metal interconnection $M_{DS}$ connects between the trench contacts 230LD and 230UD to electrically couple the lower drain/source region 214LD and the upper drain/source region 214UD. The metal interconnect $M_{SD}$ is connected between the trench contact 230LS and a via 238 to electrically couple the upper source/drain region 214US of the PFET 204P to a supply voltage (e.g., $V_{DD}$). The via 232LS electrically couples the lower source/drain region 214LS of the NFET 204N to ground (e.g., $V_{SS}$).

FIGS. 2C-1 and 2C-2 also show dummy gates 240 located according to a gate pitch $P_G$ in the X-axis direction relative to the lower field gate 227L and the upper field gate 227U. The supply voltage $V_{DD}$ and ground $V_{SS}$ may each be provided by one of the power rails 240. By employing $MX_2$-type 2D materials to form the lower channel structure 206L and the upper channel structure 206U, the length dimensions $LG_L$ and $LG_U$ of the CFET cell circuit 200 in the X-axis direction may be smaller than a length of a channel region in a silicon channel structure (e.g., fin) without a corresponding increase in leakage current. By reducing the length dimension $LG_L$, the gate pitch $P_G$ of the CFET cell circuit 200, which determines a dimension of the CFET cell circuit 200 in the X-axis direction, may also be smaller.

Figure 2D:
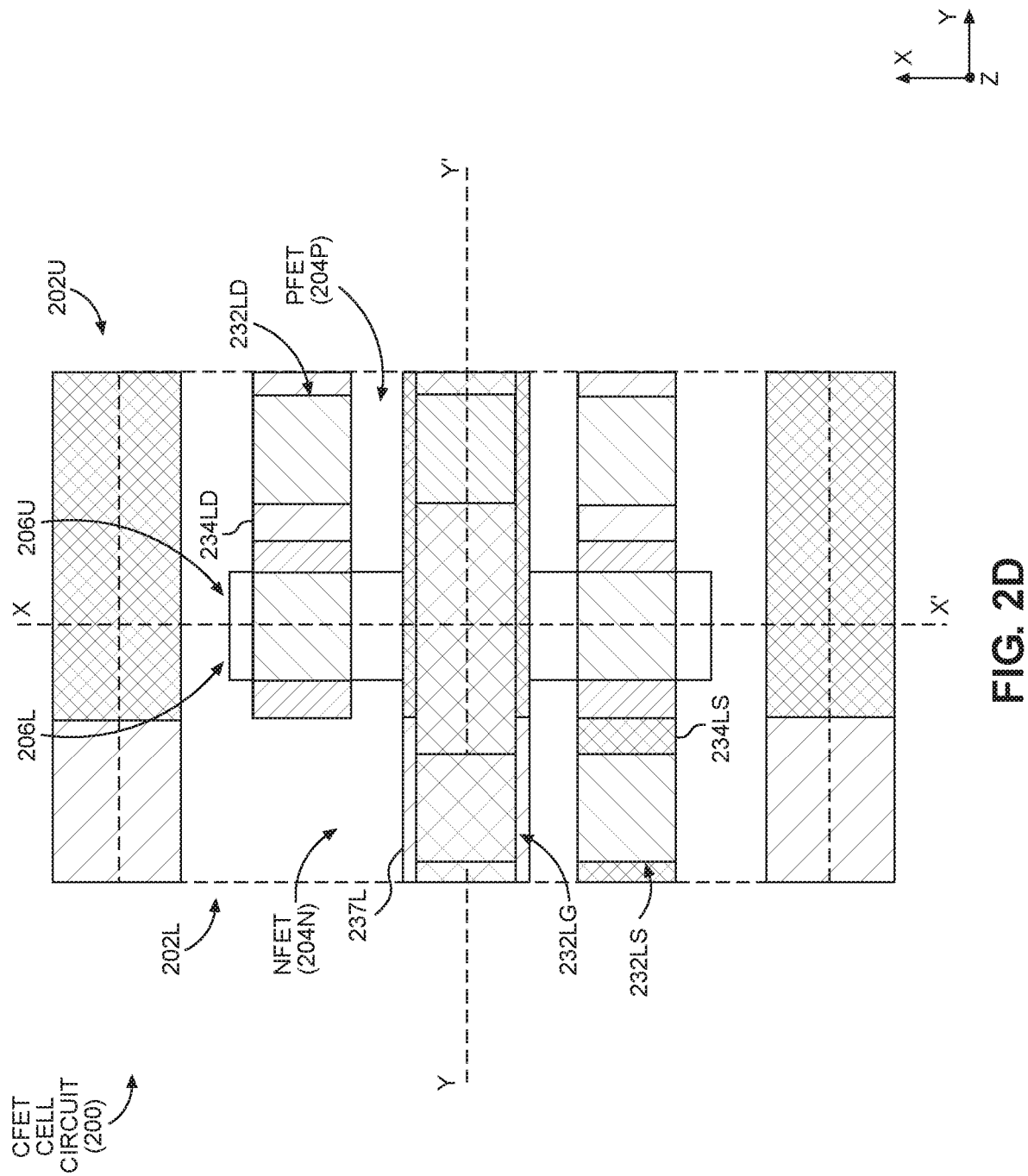
FIG. 2D is a top view of the lower and upper circuit layers of the CFET cell circuit in FIGS. 2C-1 and 2C-2, respectively, forming the CFET cell circuit in FIGS. 2A and 2B.

FIG. 2D shows a top view of the CFET cell circuit 200 with the upper circuit layer 202U of FIG. 2C-2 disposed above and in horizontal alignment with the lower circuit layer 202L of FIG. 2C-1. FIG. 2D shows the upper channel structure 206U disposed directly above the lower channel structure 206L to reduce a dimension of the CFET cell circuit 200 in the Y-axis direction. To avoid vertical obstruction created by locating the upper channel structure 206U directly above the lower channel structure 206L, the horizontal interconnects 234LS, 234LD and the lower field gate 227L provide unobstructed vertical access locations for the vias 232LS, 232LG, and 232LD to electrically couple the NFET 204N to the PFET 204P and/or an external circuit.

Figure 3:
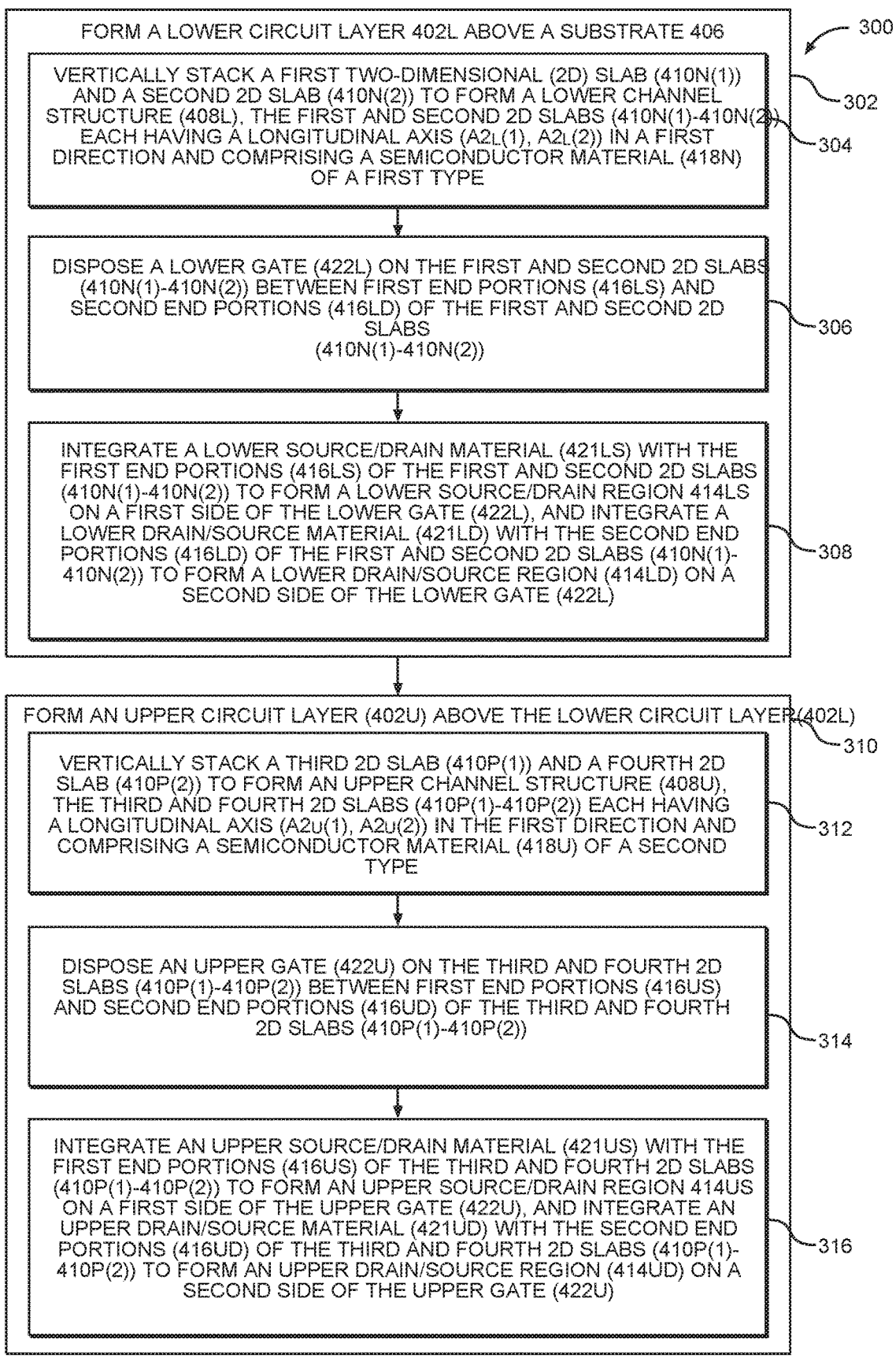
FIG. 3 is a flowchart illustrating an exemplary process for fabricating the lower and upper circuit layers that include the respective NFET and PFET in the CFET cell circuit in FIGS. 2A-2D.

FIG. 3 is a flowchart illustrating an exemplary process 300 for fabricating a CFET cell circuit 400, which corresponds to the CFET cell circuit 200 illustrated in FIGS. 2A-2D. The process 300 is explained with reference to the fabrication stages illustrated in FIGS. 4A-4O.

Figure 4A:
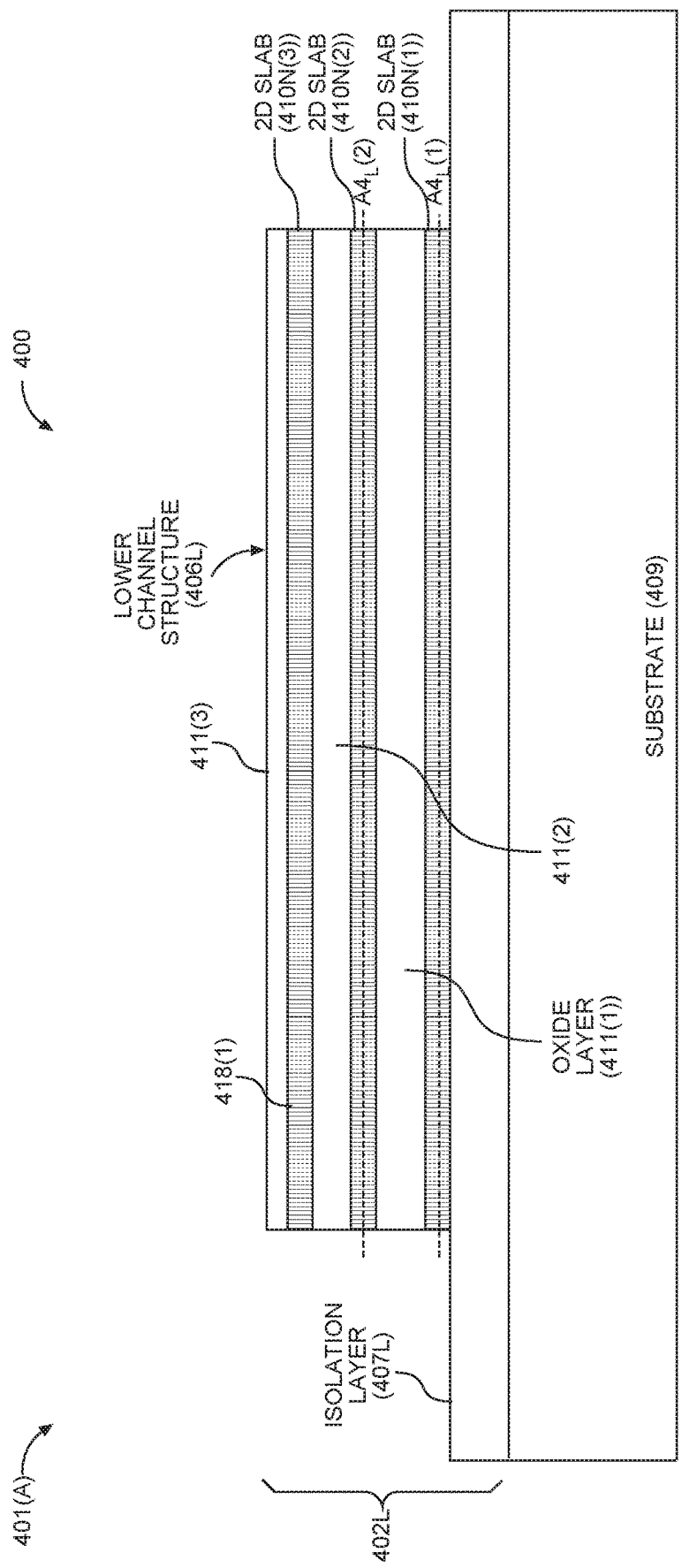
FIG. 4A is a cross-sectional side view of a first exemplary fabrication stage for fabricating the CFET cell circuit in FIGS. 2A-2D, in which a first plurality of vertically-stacked 2D slabs, each having a first semiconductor type, is disposed above a substrate, according to the exemplary fabrication process in FIG. 3.

FIG. 4A is a cross-sectional view of a first circuit layer 402L in a first fabrication stage 401(A) in which the CFET cell circuit 400 is formed. The first circuit layer 402L corresponds to the lower circuit layer 202L in FIGS. 2A-2D. An isolation layer 407L, such as a shallow trench isolation (STI) layer, is formed on a substrate 409, which may be formed of silicon. The lower circuit layer 402L including the isolation layer 407L is formed above the substrate 409 (block 302 in FIG. 3). Forming the lower circuit layer 402L includes vertically stacking a first 2D slab 410N(1) and a second 2D slab 410N(2) to form a lower channel structure 406L. The first and second 2D slabs 410N(1) and 410N(2) have longitudinal axes $A4_L(1)$ and $A4_L(2)$, respectively, in a first direction and include a semiconductor material 418(1) of a first type (e.g., one of N-type or P-type) (block 304 in FIG. 3). Vertically stacking the first and second 2D slabs 410N(1) and 410N(2) includes forming one or more layers of the semiconductor material 418(1) (e.g., monolayers of $MX_2$ material) for the first 2D slab 410N(1) on the isolation layer 407L, forming an oxide layer 411(1) on the first 2D slab 410N(1), forming one or more layers of the semiconductor material 418(1) for the second 2D slab 410N(2), and forming another oxide layer 411(2) above the second 2D slab 210N(2). Each 2D slab 410N(1), 410N(2) may include, for example, from one (1) to four (4) monolayers of the semiconductor material 418(1). In the example shown in FIGS. 4A-4O, the lower channel structure 406L includes three (3) 2D slabs 410N(1)-410N(3) and three (3) oxide layers 411(1)-411(3), but additional alternating 2D slabs and oxide layers may be vertically stacked for increased drive strength capability in the lower channel structure 406L. Using photolithographic patterning, the vertically-stacked 2D slabs 410N(1)-410N(3) and oxide layers 411(1)-411(3) are etched to form the lower channel structure 406L.

Figure 4B:
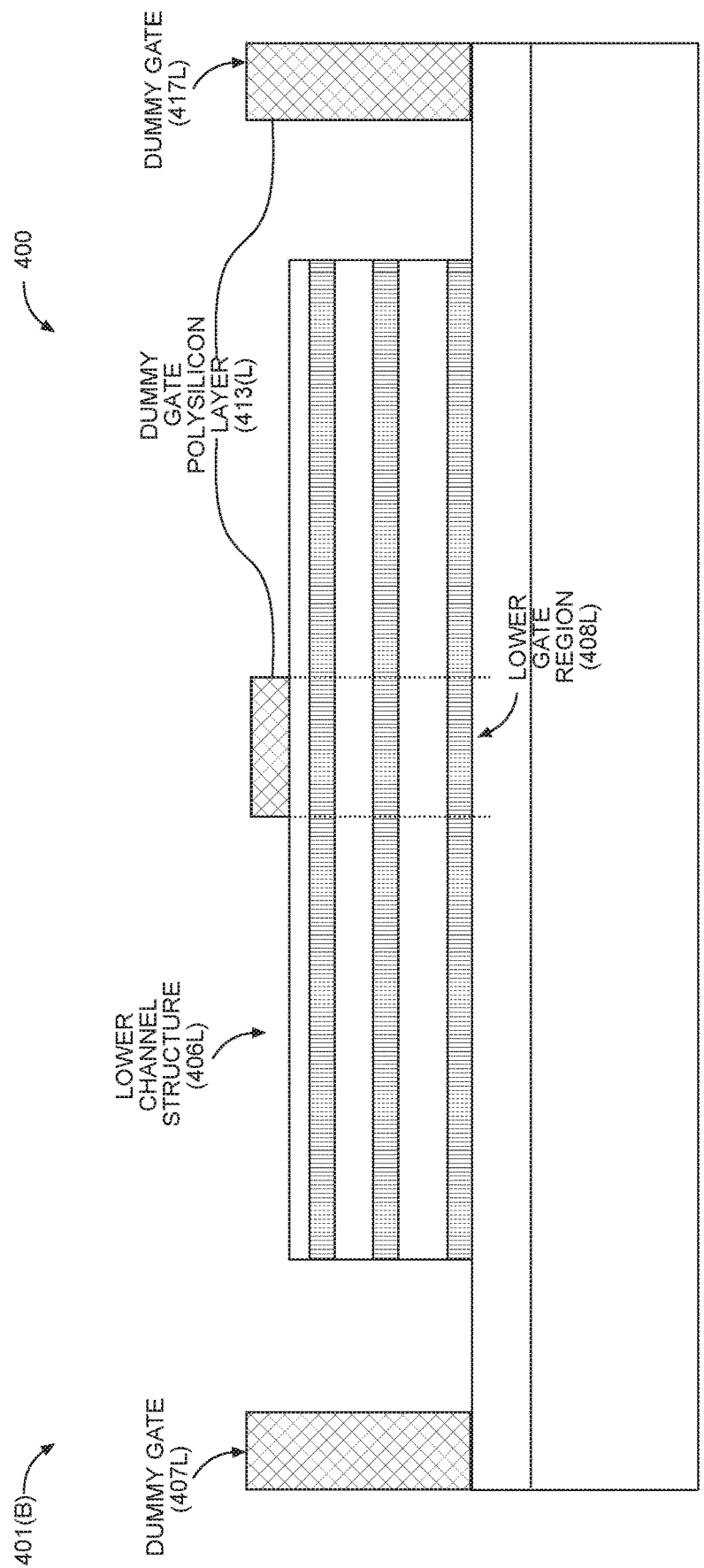
FIG. 4B is a cross-sectional side view in another exemplary fabrication stage of the CFET cell circuit in FIGS. 2A-2D of an exemplary dummy gate disposed on a lower gate region of a first plurality of vertically-integrated 2D slabs.

FIG. 4B illustrates an exemplary fabrication stage 401(B) of fabricating the CFET cell circuit 400 that further includes depositing a dummy gate polysilicon layer 413L on the lower channel structure 406L to fabrication stage 401(A) in FIG. 4A, and using photolithographic patterning and etching to remove the dummy gate polysilicon layer 413L from the lower channel structure 406L except in a lower gate region 408L. Portions of the polysilicon also remain to form dummy gate 417L at each end of the lower channel structure 406L.

Figure 4C:
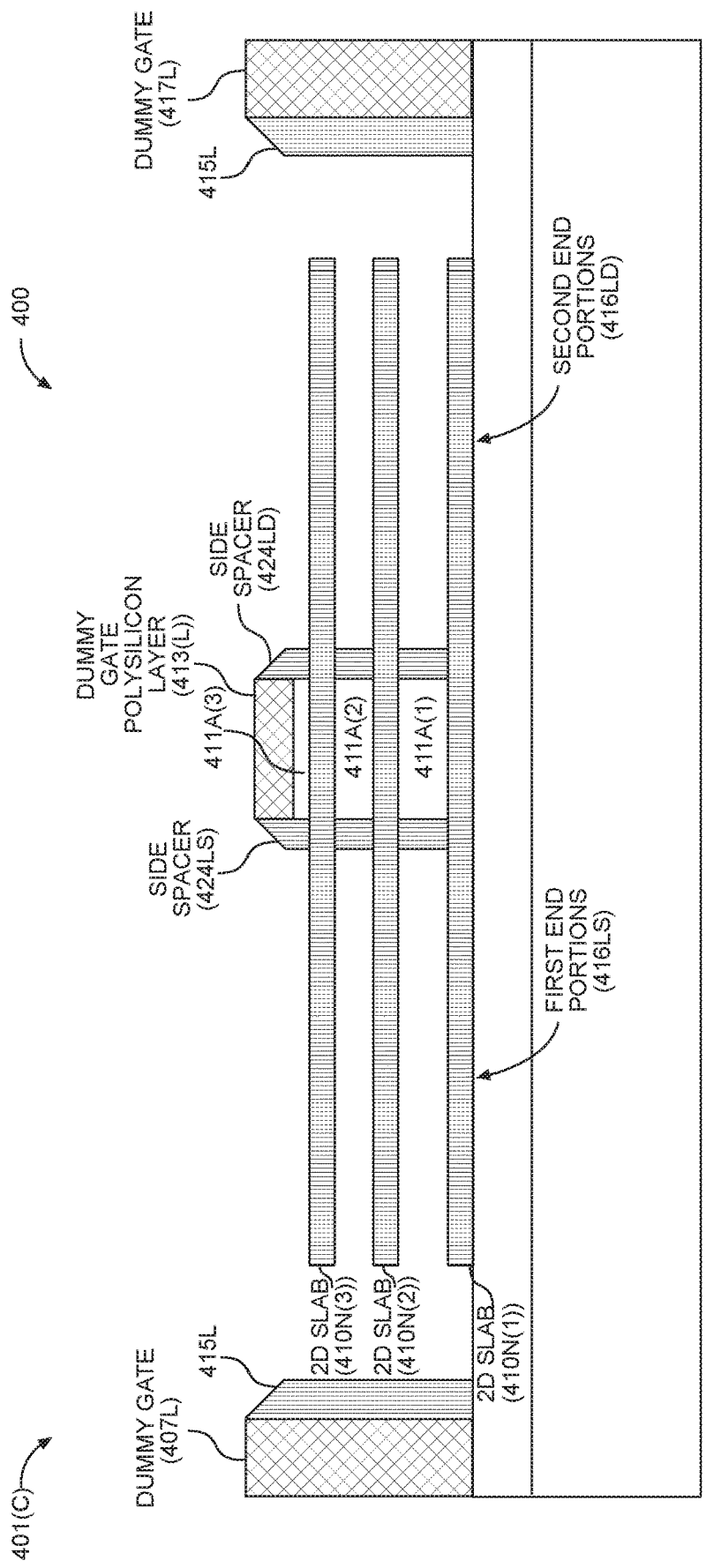
FIG. 4C is a cross-sectional side view in another exemplary fabrication stage of the CFET cell circuit in FIGS. 2A-2D in which oxide layers between first end portions and second end portions of the first plurality of vertically-integrated 2D slabs are removed, and side spacers are formed on sides of the dummy gate and sides of the lower gate region.

FIG. 4C illustrates an exemplary fabrication stage 401(C) of fabricating the CFET cell circuit 400 that further includes employing the dummy gate polysilicon layer 413L as a mask to fabrication stage 401(B) in FIG. 4B. In this regard, the oxide layers 411(1)-411(3) on and between first and second end portions 416LS and 416LD of the 2D slabs 410N(1)-410N(3) as shown in FIG. 4B are removed, but portions 411A(1)-411A(3) of the oxide layers 411(1)-411(3) beneath the dummy gate polysilicon layer 413L are not removed. A spacer layer, which may be silicon nitride (SiN or SiON), for example, is deposited on respective vertical sides of the remaining portions of the oxide layers 411(1)-411(3), and is etched to form side spacers 424LS and 424LD that will electrically isolate the lower gate 422L (see FIG. 4F) from the lower source/drain region 414LS and the lower drain/source region 414LD. Side spacers 415L may also be formed on vertical sides of the dummy gate 417L. Fabrication stage 401(C) also includes doping the first and second end portions 416LS and 416LD of the 2D slabs 410N(1)-410N(3) with a first type of dopant (not shown) to form an N-type or P-type semiconductor.

Figure 4D:
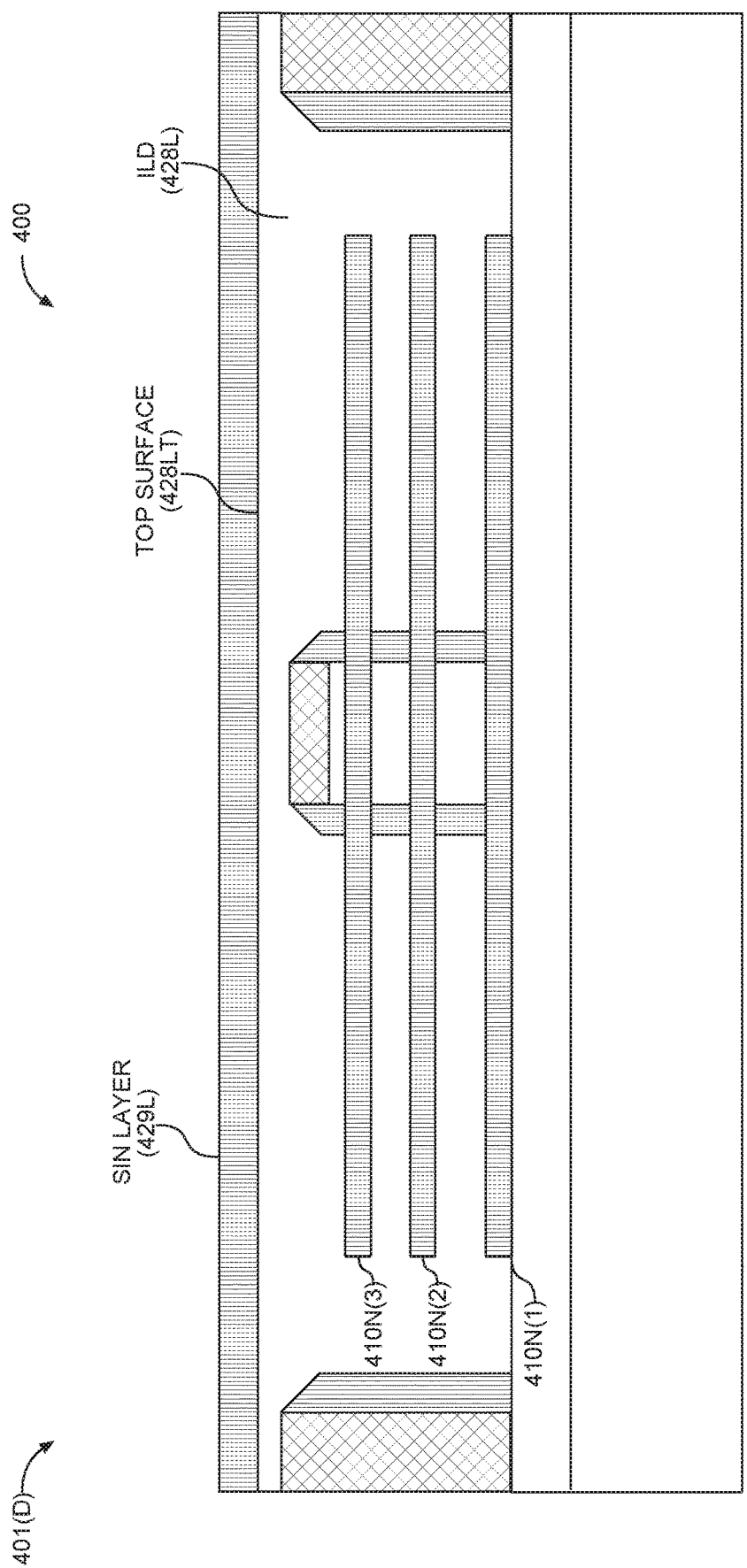
FIG. 4D is a cross-sectional side view in another exemplary fabrication stage of the CFET cell circuit shown in FIGS. 2A-2D in which an inter-layer dielectric (ILD) is formed between the first end portions and the second end portions of the first plurality of vertically-integrated 2D slabs, and the first plurality of vertically-integrated 2D slabs is covered with a mask layer.

FIG. 4D illustrates an exemplary fabrication stage 401(D) in which an ILD 428L is disposed to surround the doped 2D slabs 410N(1)-410N(3) in fabrication stage 401(C) in FIG. 4C. The ILD 428L provides a structural support for the 2D slabs 410N(1)-410N(3) and also provides electrical isolation for the lower channel structure 406L. A top surface 428LT of the ILD 428L is planarized (e.g., by chemical mechanical planarization (CMP)), and a SiN layer 429L is formed on the top surface 428LT.

Figure 4E:
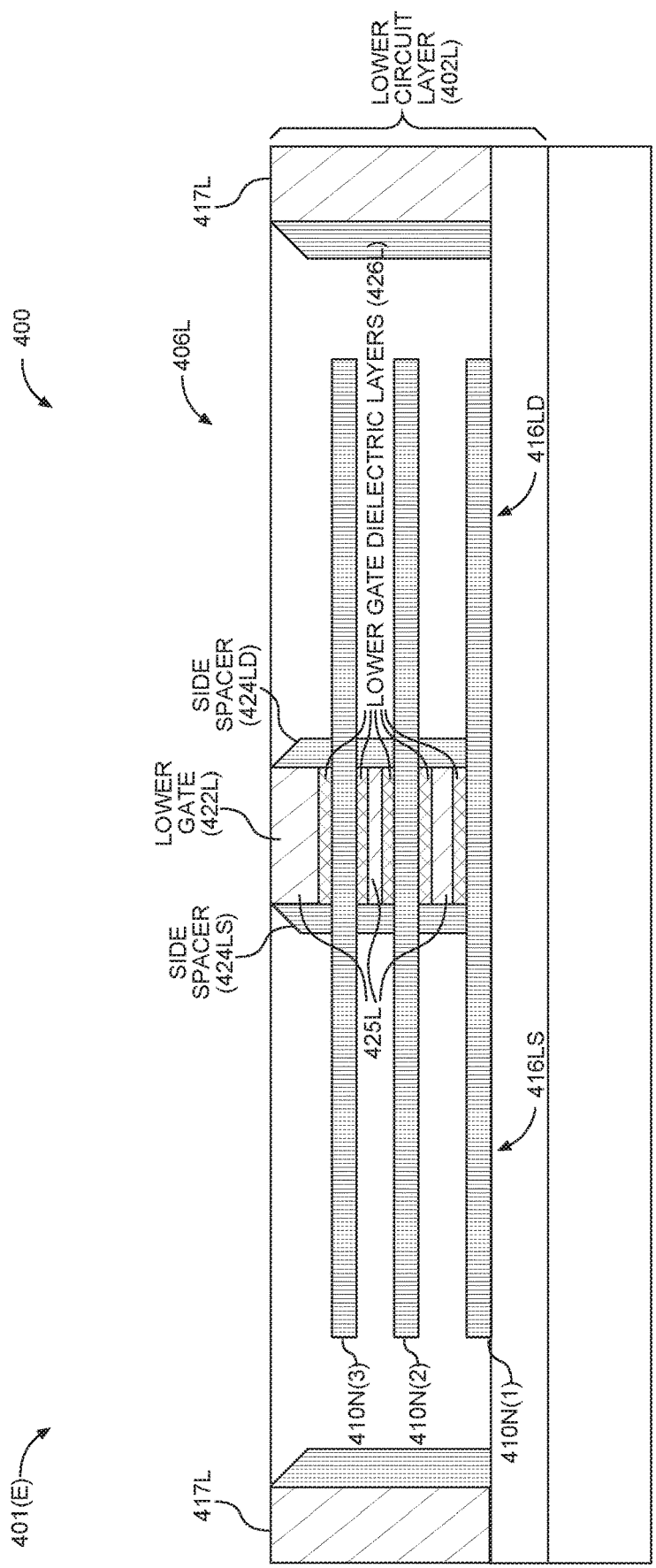
FIG. 4E is a cross-sectional side view in another exemplary fabrication stage of the CFET cell circuit in FIGS. 2A-2D in which an opening is formed in the mask layer to allow deposition of high-k dielectric material and gate metal on faces of the first plurality of vertically-integrated 2D slabs to form a lower gate in the lower gate region, according to the fabrication process in FIG. 3.

FIG. 4E illustrates an exemplary fabrication stage 401(E) in which the photolithography and etching are employed to fabrication stage 401(D) in FIG. 4D to remove the SiN layer 429L, the dummy gate polysilicon layer 413L, and the dummy gate 417L shown in FIG. 4D. In addition, the remaining portions 411A(1)-411A(3) of the oxide layers 411(1)-411(3) that are on and between the 2D slabs 410N(1)-410N(3) in the vertical direction and between the side spacers 424LS and 424LD in the horizontal direction are removed. Forming the lower circuit layer 402L further includes disposing a lower gate 422L on faces of the 2D slabs 410N(1)-410N(3) between the first and second end portions 416LS and 416LD of the 2D slabs 410N(1)-410N(3) (block 306 in FIG. 3). In this regard, lower gate dielectric layers 426L formed of a high-k dielectric material are deposited on exposed faces of the 2D slabs 410N(1)-410N(3) between the side spacers 424LS and 424LD, and gate portions 425L formed of a conductive gate material (e.g., metal) are disposed over the gate dielectric layers 426L to form the lower gate 422L. Forming the lower gate 422L may further include forming a lower field gate 427L (not shown) corresponding to the lower field gate 227L shown in FIG. 2B extending orthogonally from the lower channel structure 406L. In the fabrication stage 401(E), the polysilicon material of the dummy gate 417L is replaced with conductive metal gate material.

Figure 4F:
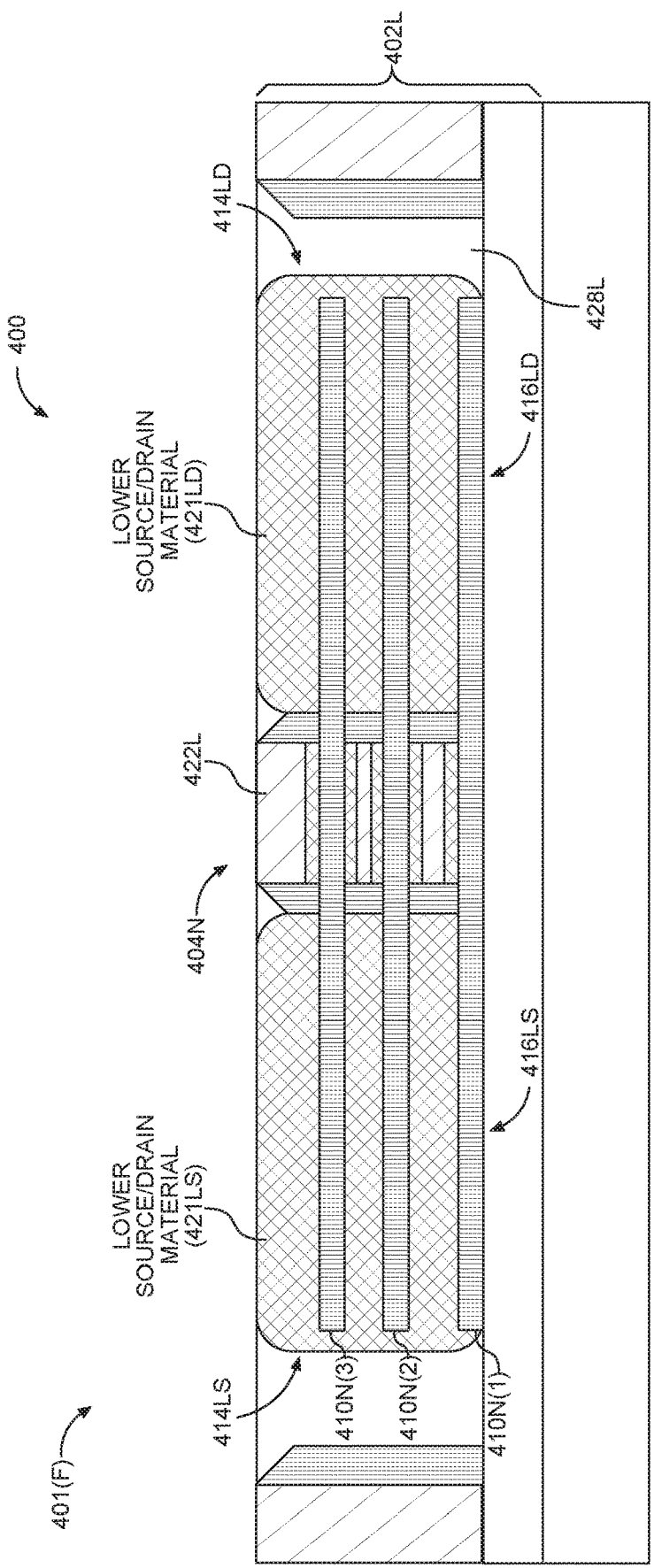
FIG. 4F is a cross-sectional side view in another exemplary fabrication stage of the CFET cell circuit in FIGS. 2A-2D in which the ILD between the first end portions and second end portions of the first plurality of vertically-integrated 2D slabs is removed and replaced by NMOS source/drain material to form a lower source/drain region and a lower drain/source region, according to the fabrication process in FIG. 3.

FIG. 4F illustrates an exemplary fabrication stage 401(F) which includes integrating a lower source/drain material 421L with the first end portions 416LS of the 2D slabs 410N(1)-410N(3) to fabrication stage 401(E) in FIG. 4E to form a lower source/drain region 414LS on a first side of the lower gate 422L, and integrating the lower source/drain material 421L with the second end portions 416LD of the 2D slabs 410N(1)-410N(3) to form a lower drain/source region 414LD on a second side of the lower gate 422L (block 308 in FIG. 3). In this regard, photolithography and etching are used to remove portions of the ILD 428L in the first and second end portions 416LS and 416LD. The ILD 428L between the 2D slabs 410N(1)-410N(3) in the first end portions 416LS is replaced by forming the lower source/drain material 421L, and the ILD 428L between the 2D slabs 410N(1)-410N(3) in the second end portions 416LD is replaced by forming the lower source/drain material 421L. The lower source/drain material 421L may be an N-type material for an NFET 404N. Alternatively, the lower source/drain material 421L may be a P-type material to form a PFET 404P in the lower circuit layer 402L.

Figure 4G:
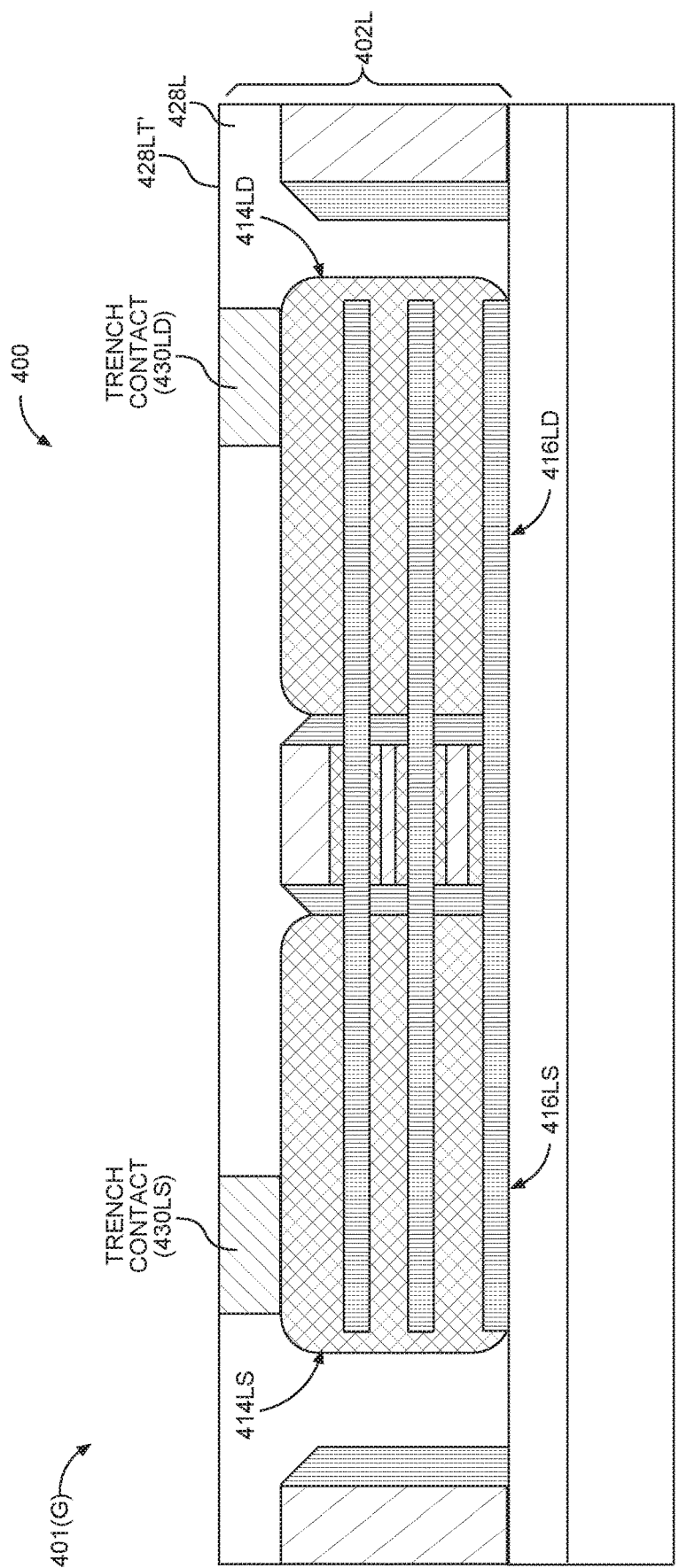
FIG. 4G is a cross-sectional side view in another exemplary fabrication stage of the CFET cell circuit in FIGS. 2A-2D in which ILD is deposited above the first plurality of vertically-integrated 2D slabs, and contacts to the lower source/drain region and lower drain/source region are formed in the ILD, according to the fabrication process in FIG. 3.

FIG. 4G illustrates an exemplary fabrication stage 401(G) of fabricating the CFET cell circuit 400 that further includes disposing more ILD to the fabrication stage 401(F) in FIG. 4F to electrically isolate the lower source/drain material 421L, which increases a thickness of the ILD 428L to form a new top surface 428LT' of the first circuit layer 402L. Photolithography and etching are employed to remove portions of the ILD 428L to open a contact area above the first end portions 416LS and the second end portions 416LD, allowing trench contacts 430LS and 430LD to be formed in contact with the lower source/drain region 414LS and the lower drain/source region 414LD by depositing metal or another conductive material. Forming the trench contacts 430LS and 430LD may include forming horizontal interconnects 434LS and 434LD (not shown), which correspond to horizontal interconnects 234LS and 234LD shown in FIG. 2C-1.

Figure 4H:
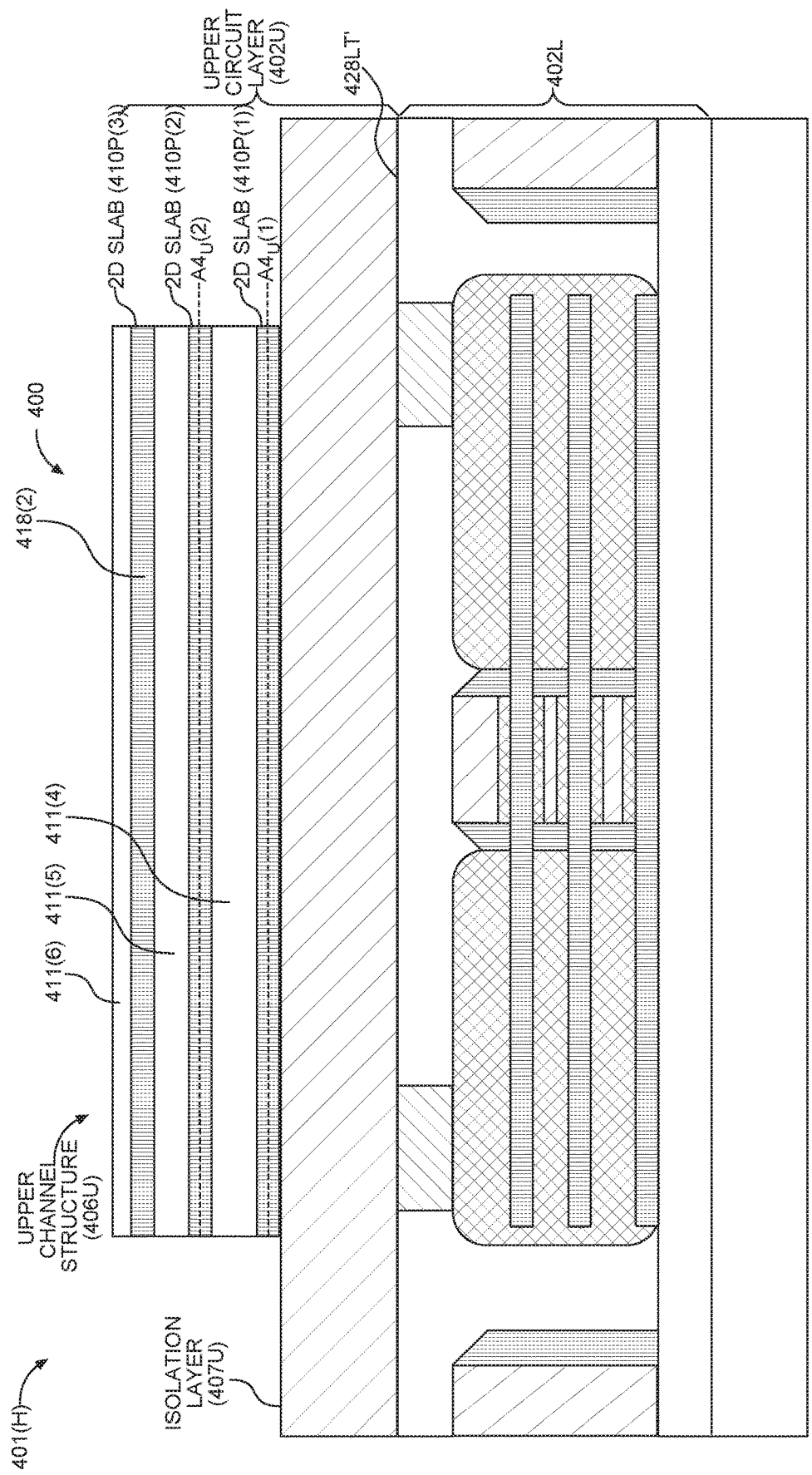
FIG. 4H is a cross-sectional side view in another exemplary fabrication stage of the CFET cell circuit in FIGS. 2A-2D in which ILD is disposed on the first plurality of vertically-integrated 2D slabs to form a lower circuit layer, and a second plurality of vertically-stacked 2D slabs, each having a second semiconductor type, is disposed above the lower circuit layer, according to the fabrication process in FIG. 3.

FIG. 4H illustrates an exemplary fabrication stage 401(H) of fabricating the CFET cell circuit 400 that further includes forming an upper circuit layer 402U (which corresponds to the upper circuit layer 202U in FIGS. 2A-2D) above the lower circuit layer 402L (block 310 in FIG. 3) in the fabrication stage 401(G) in FIG. 4G. Forming the upper circuit layer 402U includes forming an isolation layer 407U on the top surface 428LT' of the lower circuit layer 402L. Forming the upper circuit layer 402U further includes forming an upper channel structure 406U, which further includes vertically stacking a third 2D slab 410P(1) and a fourth second 2D slab 410P(2) above the isolation layer 407U. The third and fourth 2D slabs 410P(1) and 410P(2) have longitudinal axes $A4_{L}(1)$ and $A4_{L}(2)$, respectively, in the first direction, and include a semiconductor material 418(2) of a second type (e.g., one of P-type or N-type) (block 312 in FIG. 3). Vertically stacking the third and fourth 2D slabs 410P(1) and 410P(2) includes depositing one or more layers of the semiconductor material 418(2) (e.g., monolayers of $MX_2$ material) to form the third 2D slab 410P(1) on the isolation layer 407U, depositing an oxide layer 411(4) on the third 2D slab 410P(1), depositing one or more layers of the semiconductor material 418(2) to form the fourth 2D slab 410P(2), and depositing another oxide layer 411(5) above the fourth 2D slab 410P(2). Each 2D slab 410P(1), 410P(2) may include, for example, from one (1) to four (4) monolayers of the semiconductor material 418(2). In the example shown in FIGS. 4A-4O, the upper channel structure includes three (3) 2D slabs 410P(1)-410P(3) and three (3) oxide layers 411(4)-411(6), but additional alternating 2D slabs and oxide layers may be vertically stacked for increased drive strength capability in the upper channel structure 406U. Using photolithographic patterning, the vertically stacked 2D slabs 410P(1)-410P(3) and oxide layers 411(3)-411(4) are etched to form the upper channel structure 406U.

Figure 4I:
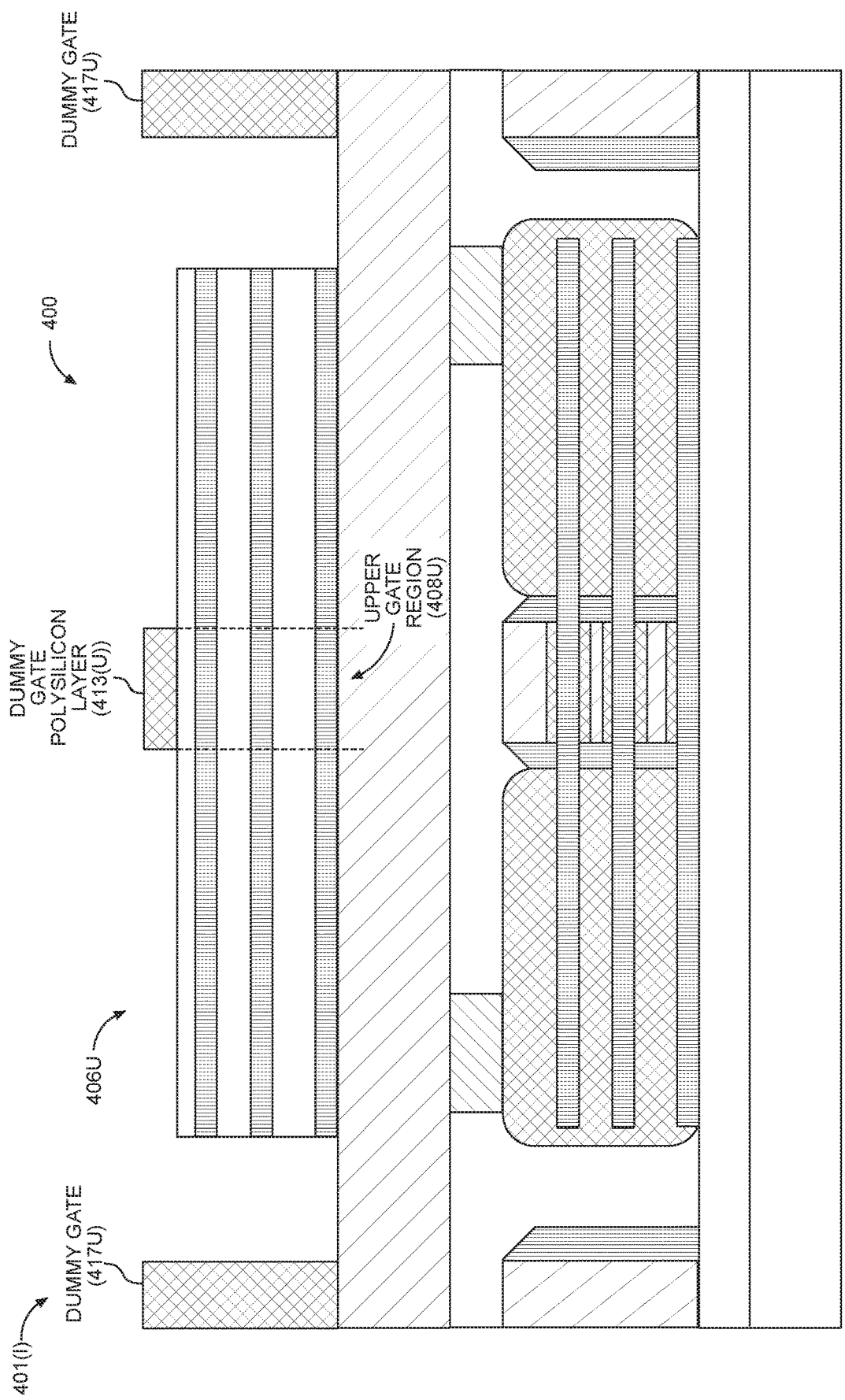
FIG. 4I is a cross-sectional side view in another exemplary fabrication stage of the CFET cell circuit in FIGS. 2A-2D in which an exemplary dummy gate is disposed on an upper gate region of the second plurality of vertically-integrated 2D slabs.

FIG. 4I illustrates an exemplary fabrication stage 401(I) of fabricating the CFET cell circuit 400 that further includes depositing a dummy gate polysilicon layer 413U on the upper channel structure 406U in the fabrication stage 401(H) in FIG. 4H, and using photolithographic patterning and etching to remove the dummy gate polysilicon layer 413U from the upper channel structure 406U except in an upper gate region 408U. Portions of the polysilicon also remain to form dummy gate 417U at each end of the upper channel structure 406U.

Figure 4J:
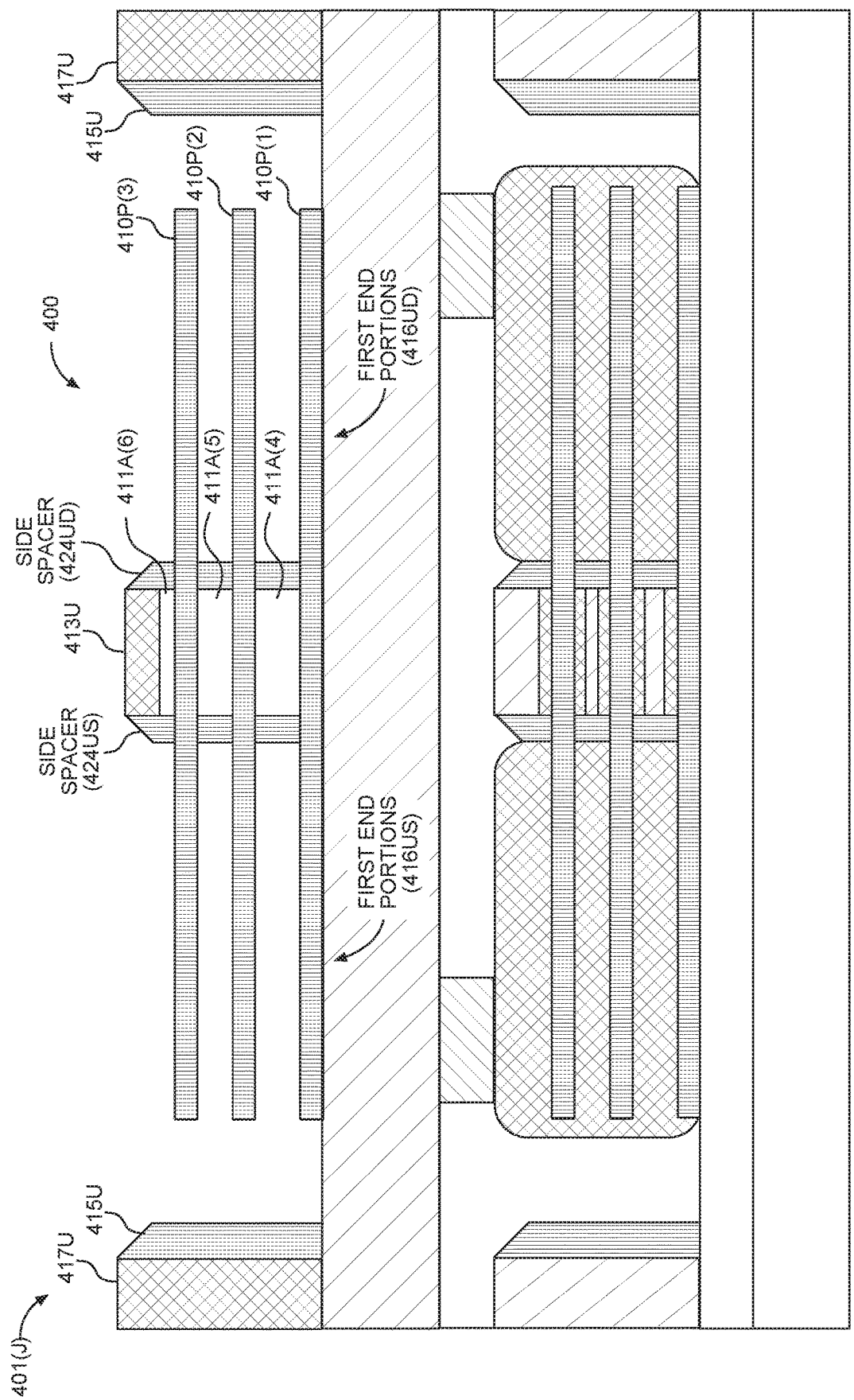
FIG. 4J is a cross-sectional side view in another exemplary fabrication stage of the CFET cell circuit in FIGS. 2A-2D in which oxide layers between first end portions and second end portions of the second plurality of vertically-integrated 2D slabs are removed, and side spacers are formed on sides of the dummy gate and sides of the upper gate region.

FIG. 4J illustrates an exemplary fabrication stage 401(J) of fabricating the CFET cell circuit 400 that further includes employing the dummy gate polysilicon layer 413U in the fabrication stage 401(I) in FIG. 4I as a mask. In this regard, the oxide layers 411(4)-411(6) on and between first and second end portions 416US and 416UD of the 2D slabs 410P(1)-410P(3) are removed, but portions 411A(4)-411A(6) of the oxide layers 411(4)-411(6) beneath the dummy gate polysilicon layer 413U are not removed. A spacer layer, which may be silicon nitride (SiN), for example, is deposited on respective vertical sides of the remaining portions of the oxide layers 411(4)-411(6), and is etched to form side spacers 424US and 424UD that will electrically isolate the upper gate 422U (see FIG. 4M) from the upper source/drain region 414US and the upper drain/source region 414UD. Side spacers 415U may also be formed on vertical sides of the dummy gate 417U. Fabrication stage 401(J) also includes doping the first and second end portions 416US and 416UD of the 2D slabs 410P(1)-410P(3) with a second type of dopant to form a P-type or N-type semiconductor.

Figure 4K:
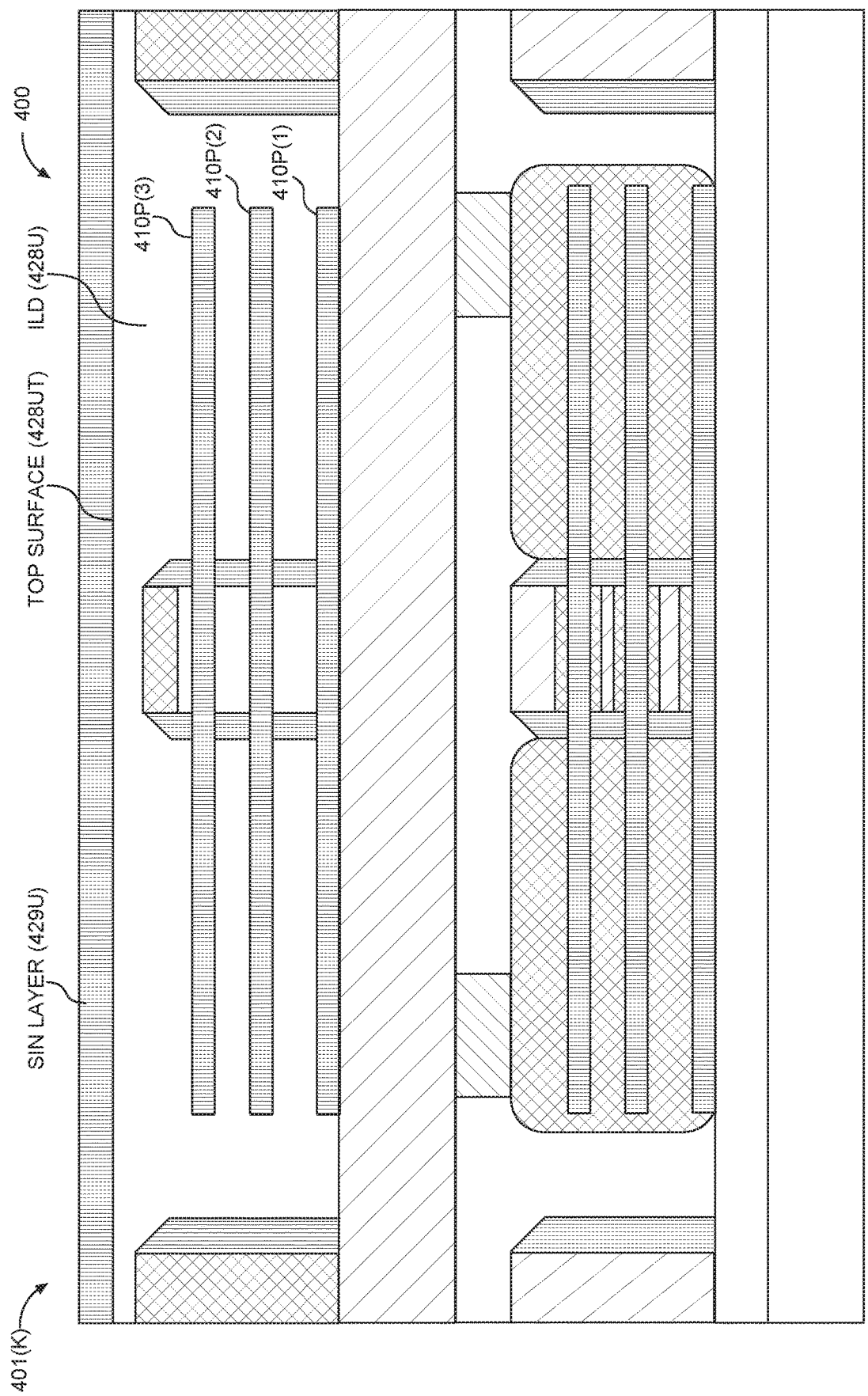
FIG. 4K is a cross-sectional side view in another exemplary fabrication stage of the CFET cell circuit in FIGS. 2A-2D in which ILD is formed between the first end portions and the second end portions of the second plurality of vertically-integrated 2D slabs, and the second plurality of vertically-integrated 2D slabs is covered with a mask layer.

FIG. 4K illustrates an exemplary fabrication stage 401(K) in which an ILD 428U is disposed to surround the doped 2D slabs 410P(1)-410P(3) in the fabrication stage 401(J) in FIG. 4J. A top surface 428UT of the ILD 428U is planarized (e.g., by chemical mechanical planarization (CMP)), and a SiN layer 429U is formed on the top surface 428UT.

Figure 4L:
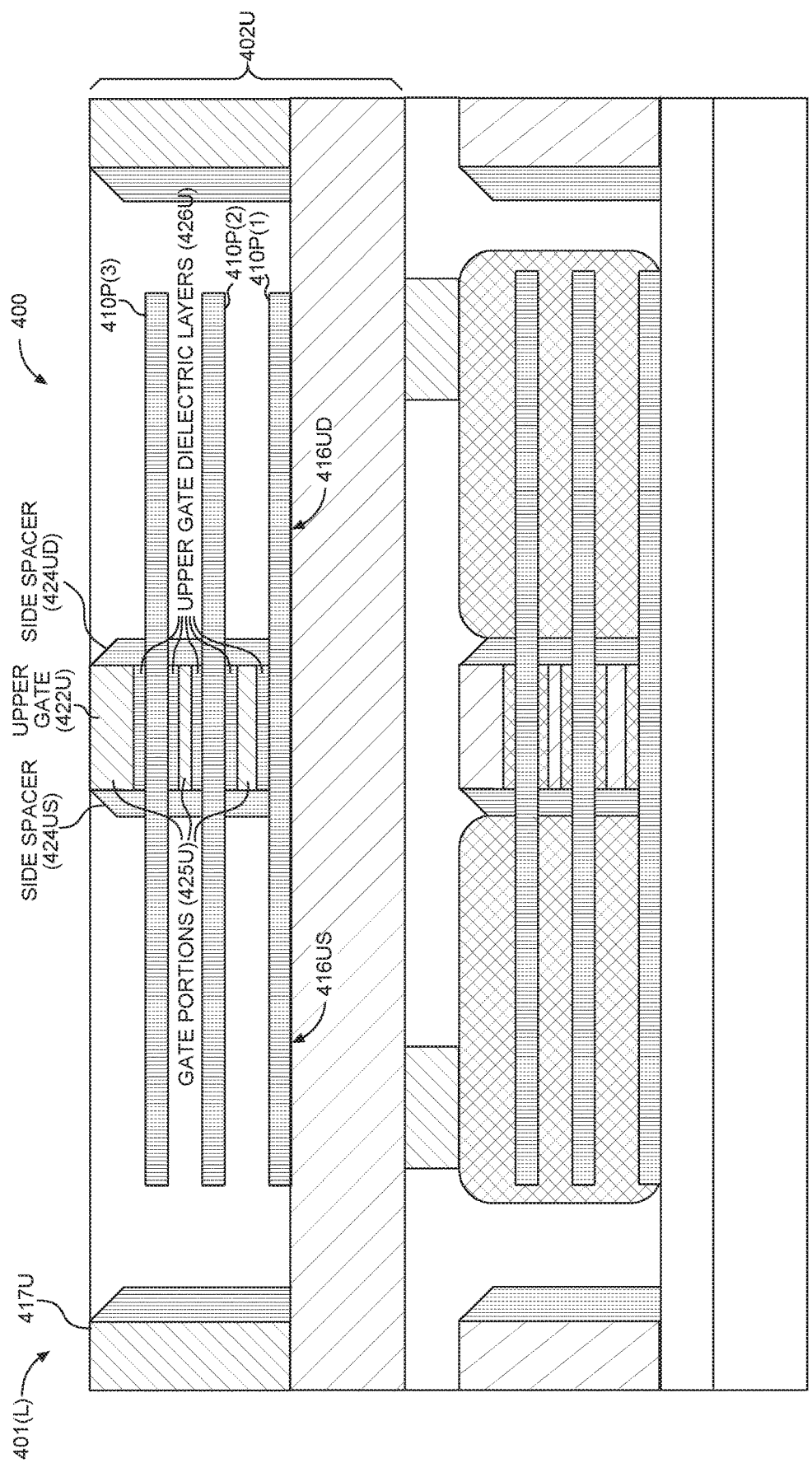
FIG. 4L is a cross-sectional side view in another exemplary fabrication stage of the CFET cell circuit in FIGS. 2A-2D in which an opening is formed in the mask layer in FIG. 4K to allow deposition of high-k dielectric material and gate metal on faces of the second plurality of vertically-integrated 2D slabs to form an upper gate in the upper gate region, according to the fabrication process in FIG. 3.

FIG. 4L illustrates an exemplary fabrication stage 401(L) in which photolithography and etching are employed to remove the dummy gate polysilicon layer 413U and the dummy gate 417U of the CFET cell circuit 400 in the fabrication stage 401(K) in FIG. 4K. In addition, the remaining portions 411A(4)-411A(6) of the oxide layers 411(4)-411(6) that are on and between the 2D slabs 410P(1)-410P(3) in the vertical direction and between the side spacers 424US and 424UD in the horizontal direction are removed. Forming the upper circuit layer 402U above the lower circuit layer 402L further includes disposing an upper gate 422U on faces of the 2D slabs 410P(1)-410P(3) between the first and second end portions 416US and 416UD of the 2D slabs 410P(1)-410P(3) (block 314 in FIG. 3). In this regard, upper gate dielectric layers 426U of a high-k material are deposited on exposed faces of the 2D slabs 410P(1)-410P(3) between the side spacers 424US and 424UD, and gate portions 425U formed of a conductive gate material (e.g., metal) are disposed over the upper gate dielectric layers 426U to form an upper gate 422U. An upper field gate 427U (not shown) corresponding to the upper field gate 227U in FIG. 2B may also be formed with the upper gate 422U in the upper circuit layer 402U. The polysilicon material of the dummy gate 417U is also replaced with conductive metal gate material in this stage.

Figure 4M:
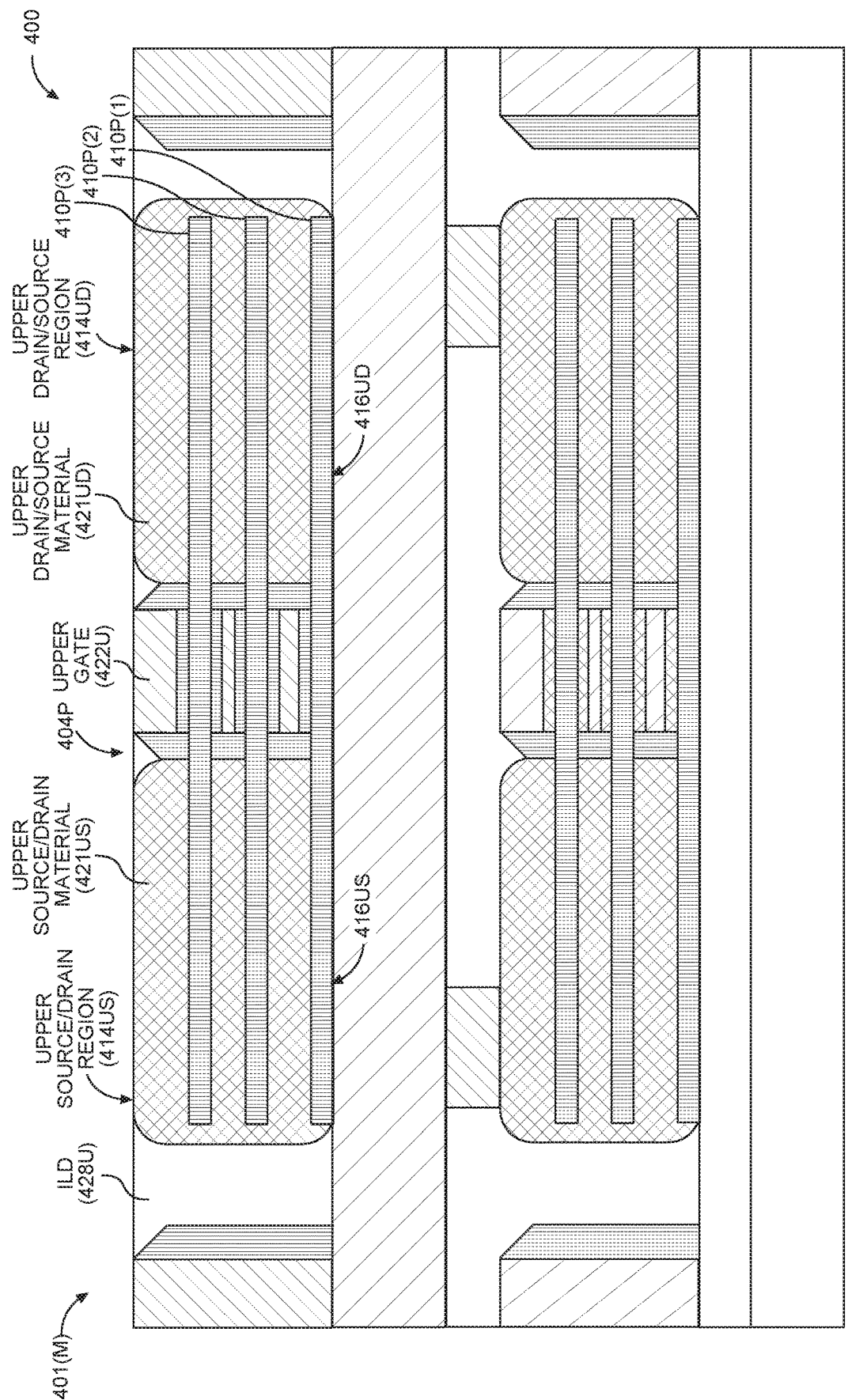
FIG. 4M is a cross-sectional side view in another exemplary fabrication stage of the CFET cell circuit in FIGS. 2A-2D in which the ILD between the first end portions and second end portions of the second plurality of vertically-integrated 2D slabs is removed and replaced by PMOS source/drain material to form an upper source/drain region and an upper drain/source region, according to the fabrication process in FIG. 3.

FIG. 4M illustrates an exemplary fabrication stage 401(M) which includes integrating an upper source/drain material 421U with the first end portions 416US of the 2D slabs 410P(1)-410P(3) to form an upper source/drain region 414US on a first side of the upper gate 422U in the fabrication stage 401(L) in FIG. 4L, and integrating the upper source/drain material 421U with the second end portions 416UD of the 2D slabs 410P(1)-410P(3) to form an upper drain/source region 414UD on a second side of the upper gate 422U (block 316 in FIG. 3). In this regard, photolithography and etching are used to remove portions of the ILD 428U in the first and second end portions 416US and 416UD. The ILD 428U between the 2D slabs 410P(1)-410P(3) in the first end portions 416US is replaced with the upper source/drain material 421U, and the ILD 428U between the 2D slabs 410P(1)-410P(3) in the second end portions 416UD is replaced with the upper source/drain material 421U. The upper source/drain material 421U may be a P-type material for a PFET 404P. Alternatively, the upper source/drain material 421U may each be an N-type material to form an NFET 404N in the upper circuit layer 402U.

Figure 4N:
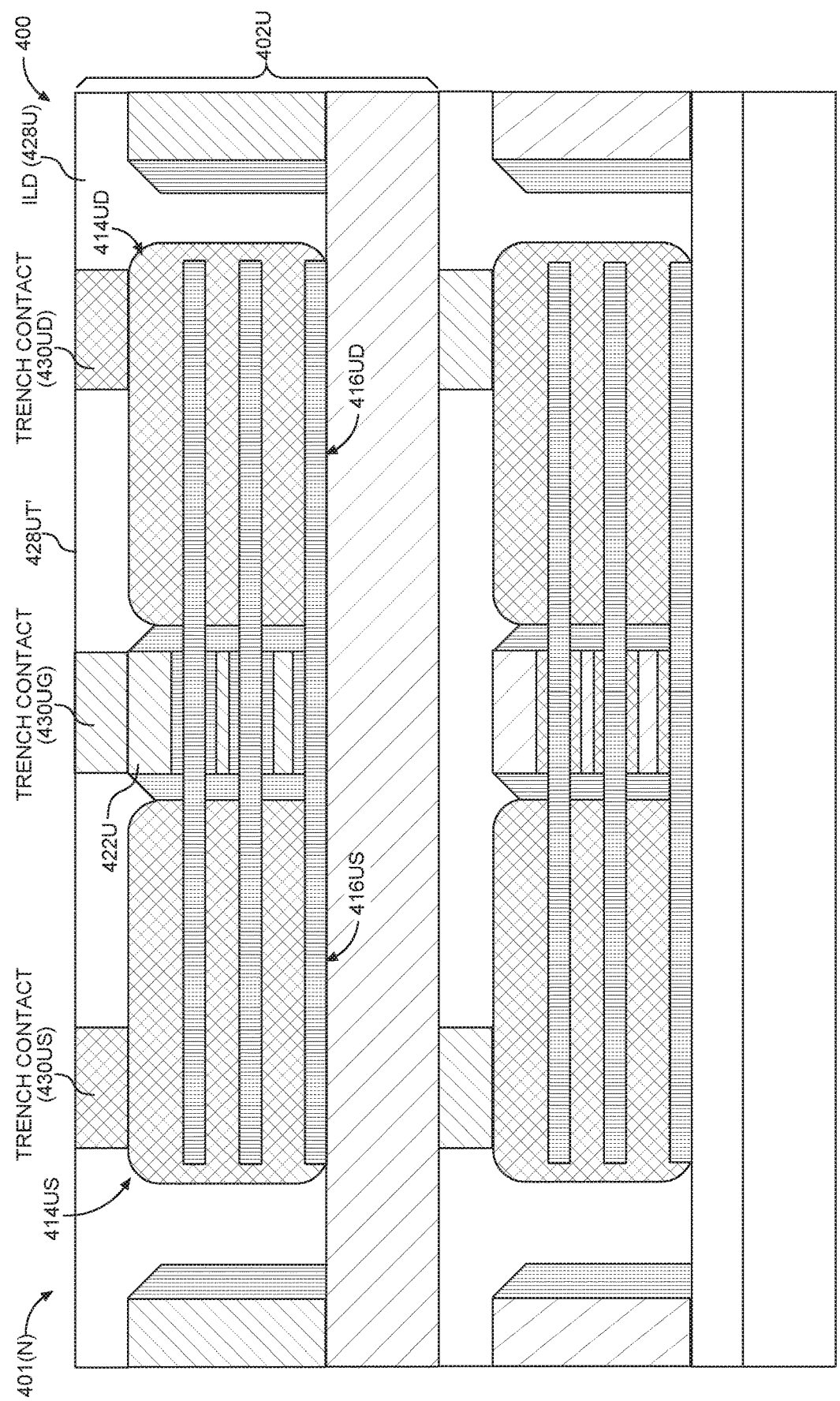
FIG. 4N is a cross-sectional side view in another exemplary fabrication stage of the CFET cell circuit in FIGS. 2A-2D in which ILD is deposited above the second plurality of vertically-integrated 2D slabs, and contacts to the upper source/drain region and upper drain/source region are formed in the ILD.

FIG. 4N illustrates an exemplary fabrication stage 401(N) of fabricating the CFET cell circuit 400 that further includes disposing more ILD to increase a thickness of the ILD 428U in the fabrication stage 401(M) in FIG. 4M to form a new top surface 428UT' of the upper circuit layer 402U. Photolithography and etching are employed to remove portions of the ILD 428U to open a contact area above the first end portions 416US and the second end portions 416UD, allowing trench contacts 430US and 430UD to be formed in contact with the upper source/drain region 414US and the upper drain/source region 414UD by deposition of metal or another conductive material. In the same manner, a trench contact 430UG is formed on the upper gate 422U. Forming the trench contacts 430US and 430UD may include forming horizontal interconnects 434US and 434UD (not shown), which correspond to horizontal interconnects 234US and 234UD in FIG. 2C-2. The top surface 428UT' is planarized by CMP.

Figure 4O:
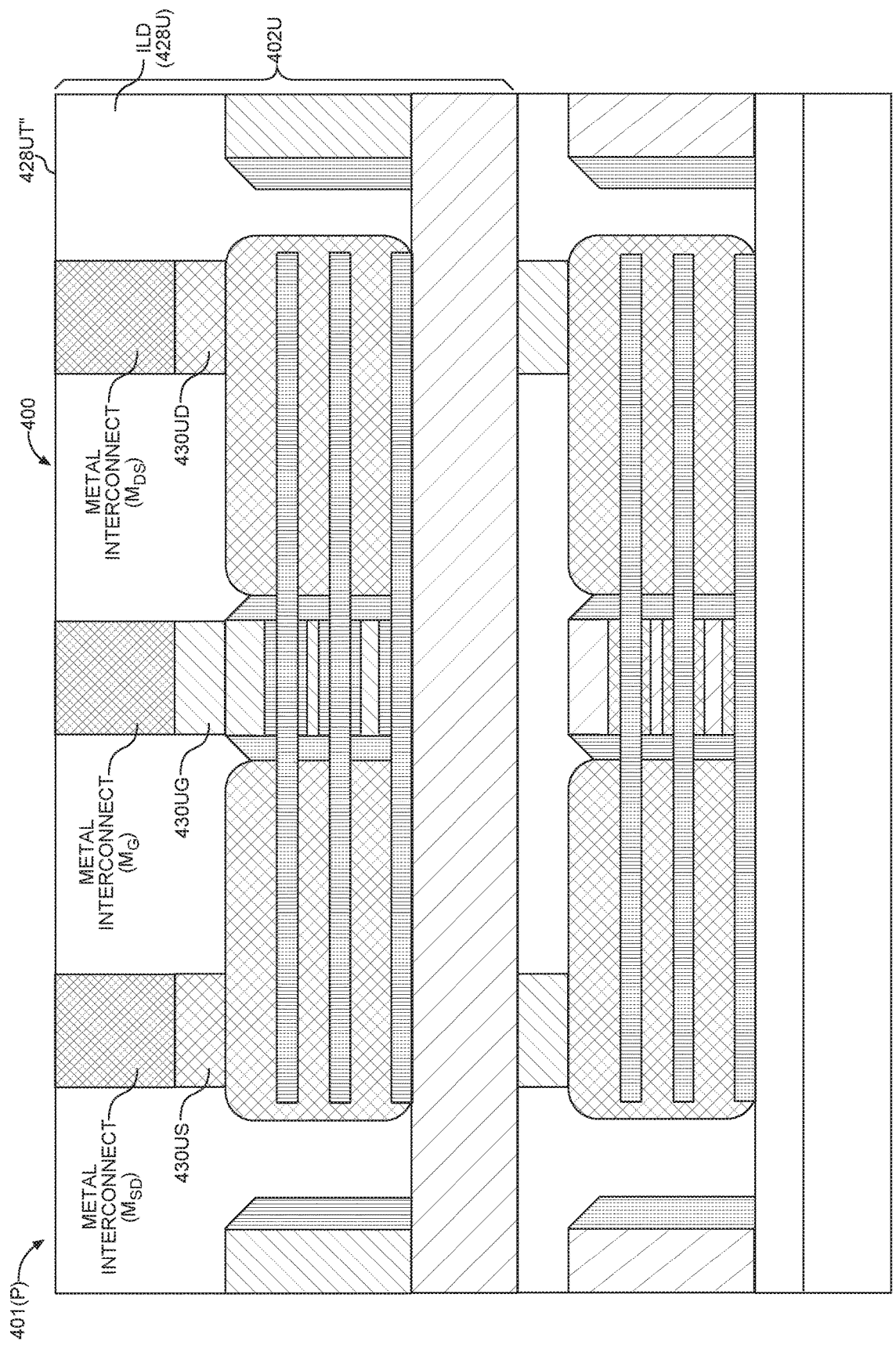
FIG. 4O is a cross-sectional side view in an another exemplary fabrication stage of the CFET cell circuit in FIGS. 2A-2D in which additional ILD is deposited above the contacts to the upper source/drain region and the upper drain/source region, and metal interconnects coupled to the contacts are formed in the additional ILD.

FIG. 4O illustrates an exemplary fabrication stage 401(O) of fabricating the CFET cell circuit 400 that further includes disposing more ILD to further increase a thickness of the ILD 428U in the fabrication stage 401(N) in FIG. 4N to form another new top surface 428UT" of the upper circuit layer 402U. Photolithography and etching are employed to remove portions of the ILD 428U over the trench contacts 430US, 430UG, and 430UD where the metal layer interconnects $M_{SD}$, $M_G$, and $M_{Ds}$, respectively, are formed to provide connections to the CFET cell circuit 400. In the fabrication stage 401(O), the top surface 428UT" is planarized by CMP.

Figure 5A:
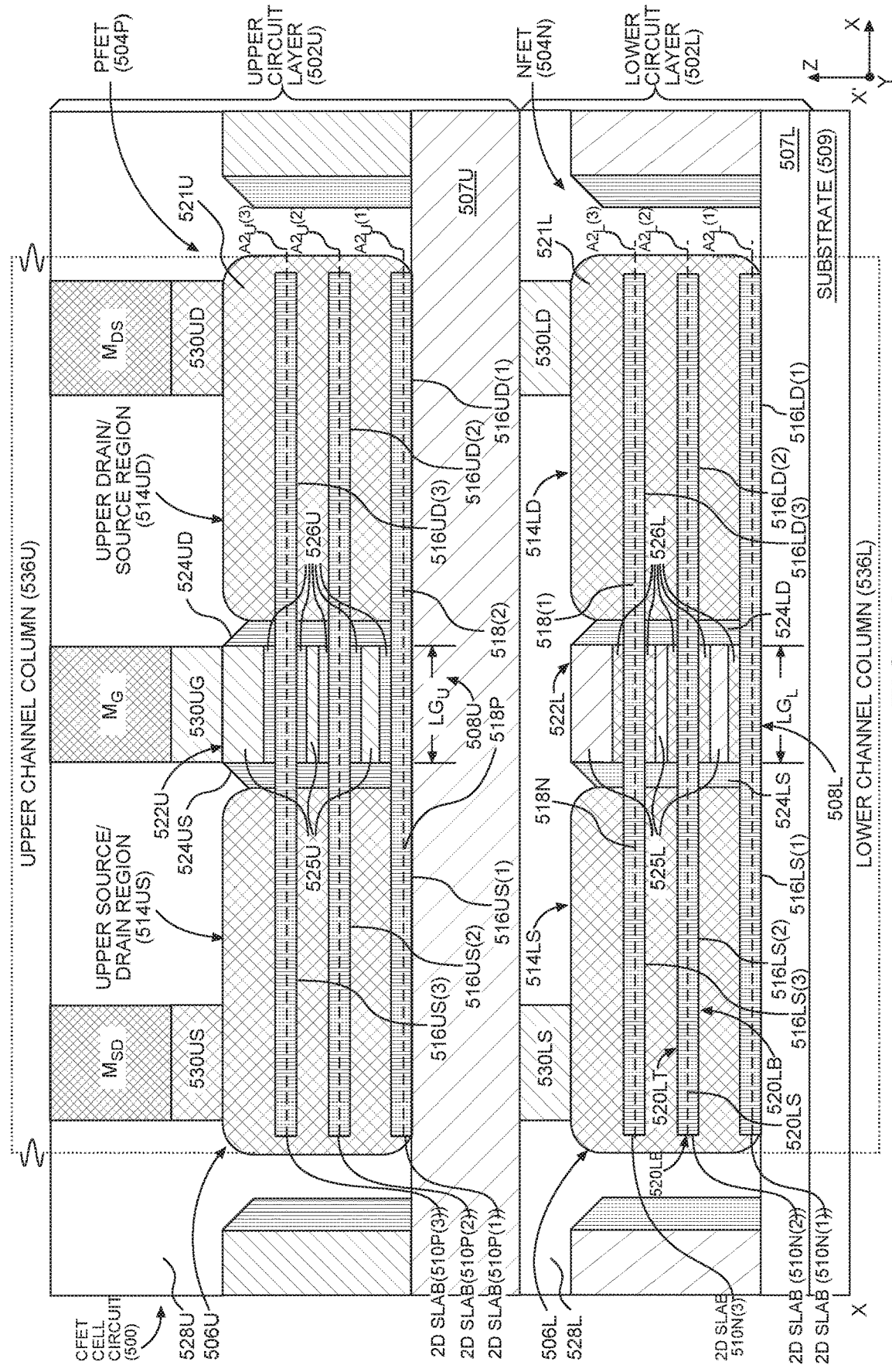
FIG. 5A is a cross-sectional side view in a first direction of another exemplary CFET cell circuit with a lower circuit layer including a PFET disposed above a substrate, the PFET including a lower channel structure formed of vertically-integrated 2D semiconductor slabs of a first type, and an upper circuit layer including an NFET disposed above the lower circuit layer, the NFET including an upper channel structure formed of vertically-integrated 2D semiconductor slabs of a second type to reduce the footprint size of the CFET cell circuit.

FIG. 5A is a cross-sectional view of a CFET cell circuit 500 in the X-axis and Z-axis directions shown therein. The cross-sectional view shown in FIG. 5A is taken along the line X-X' shown in a top view of the CFET cell circuit 500 illustrated in FIG. 5D. The CFET cell circuit 500 corresponds to the CFET cell circuit 200 in FIGS. 2A-2D, except with respect to the semiconductor types of the FETs in the lower and upper layers. Specifically, in contrast to the CFET cell circuit 200, in which the NFET 204N is in the lower circuit layer 202L and the PFET 204P is in the upper circuit layer 202U, the CFET cell circuit 500 includes a PFET 504P in a lower circuit layer 502L and an NFET 504N in an upper circuit layer 502U. As will be discussed in more detail below, the CFET cell circuit 500 includes an upper circuit layer 502U with an NFET 504N disposed vertically above (i.e., stacked above) a lower circuit layer 502L with a PFET 504P. In this manner, the vertical stacking reduces the horizontal footprint of the CFET cell circuit 500 in the Y-axis direction. As in the CFET cell circuit 200, the PFET 504P and the NFET 504N may be interconnected in a complementary configuration, as in a CMOS circuit.

In addition, an X-axis dimension of a footprint of the CFET cell circuit 500 may be reduced by reducing length dimensions of the PFET 504P and the NFET 504N. In particular, the PFET 504P in the lower circuit layer 502L is formed in a lower channel structure 506L in which a gate region 508L has a length dimension $LG_L$ in the X-axis direction, and the NFET 504N in the upper circuit layer 502U is formed in an upper channel structure 506U in which a gate region 508U has a length dimension $LG_U$ in the X-axis direction. By reducing the length dimensions $LG_L$ and $LG_U$, a dimension in the X-axis direction of the footprint of the CFET cell circuit 500 may be reduced.

In an exemplary aspect, $MX_2$-type compounds (e.g., transition metal dichalcogenide crystals), known as "2D materials," may be employed in the semiconductor channel structures of the PFET 504P and NFET 504N to reduce the lengths $LG_L$ and $LG_U$ in the X-axis direction without a corresponding increase in leakage current associated with reducing a length of a gate region of a silicon channel structure. In the CFET cell circuit 500 in FIG. 5A, the lower circuit layer 502L includes the PFET 504P, and the upper circuit layer 502U includes the NFET 504N. The PFET 504P is disposed on an isolation layer 507L above a substrate 509. The lower channel structure 506L includes a first 2D slab 510P(1) of the 2D material vertically integrated with a second 2D slab 510P(2) of the 2D material. In the CFET cell circuit 500 in FIG. 5A, a "slab" is a structure formed of one or more layers of a 2D material with first and second dimensions in orthogonal directions (e.g., X-axis and Y-axis directions) and having a thickness dimension which is orthogonal to the first and second dimensions (e.g., Z-axis direction) and is smaller than the first and second dimensions. As shown in a top view of the CFET cell circuit 500 in FIG. 5C-1 below, the first and second 2D slabs 510P(1) and 510P(2) may each extend in a range from 20 nm to 500 nm in a longitudinal direction (e.g., X-axis direction), and extend in a range from 3 nm to 50 nm in a direction orthogonal to the longitudinal direction (e.g., Y-axis direction). As shown in FIG. 5A, the first and second 2D slabs 510P(1) and 510P(2) have a thickness dimension, which may be in the range from 0.6 nm to 10.0 nm. The lower channel structure 506L in FIG. 5A may also include additional 2D slabs, such as third 2D slab 510P(3) vertically integrated with the first and second 2D slabs 510P(1) and 510P(2) to increase a drive strength of the PFET 504P. Although the slab structures in FIG. 5A may appear to be planar, stackable slabs having other (e.g., non-planar) shapes are within the scope of the present disclosure.

Each of the 2D slabs 510P(1)-510P(3) includes at least one monolayer (not individually shown) of a first type of 2D semiconductor material 518(1), such as a P-type material 518P, extending in the X-axis direction and the Y-axis direction. 2D materials are atomically thin semiconductor monolayers of the type $MX_2$, where M is a transition metal atom (Mo, W, etc.) and X is a chalcogen atom (S, Se, or Te). For example, the P-type material 518P may be molybdenum disulfide ($MoS_2$). Crystal monolayers of $MX_2$ compounds have a higher carrier mobility, lower dielectric constant, and thinner channel thickness than silicon, providing a strong on/off control of the channel. Therefore, a channel structure formed of $MX_2$ compounds may have higher drive strength and lower leakage current than a similarly-sized silicon channel structure. By employing the P-type material 518P in the 2D slabs 510P(1)-510P(3), channel control in a lower gate region 508L is improved over a channel region of the same length in a channel structure formed of silicon. Therefore, by employing the P-type material 518P in the lower channel structure 506L, rather than silicon, the length $LG_L$ of the lower gate region 508L may be made smaller to reduce a dimension of the CFET cell circuit 500 in the X-axis direction without a causing an increase in leakage current in the PFET 504P. The 2D slabs 510P(1)-510P(3) extend along respective longitudinal axes $A5_L(1)$-$A5_L(3)$ and may be integrated by stacking in a vertical (e.g., Z-axis) direction one above another. By vertically stacking the 2D slabs 510N(1)-510N(3) such that their longitudinal axes $A5_L(1)$-$A5_L(3)$ overlap (e.g., in the Z-axis direction), an area occupied by the lower channel structure 506L is minimized.

With continuing reference to FIG. 5A, the lower channel structure 506L also includes a lower source/drain material 521L integrated with first end portions 516LS(1)-516LS(3) of the 2D slabs 510P(1)-510P(3) for forming a lower source/drain region 514LS and the lower source/drain material integrated with second end portions 516LD(1)-516LD(3) of the 2D slabs 510P(1)-510P(3) to form a lower drain/source region 514LD. In operation of the PFET 504P, either the lower source/drain region 514LS or the lower drain/source region 514LD may function as a source while the other functions as a drain. Integration of the lower source/drain region 514LS and the lower drain/source region 514LD with the respective end portions 516LS(1)-516LS(3) and 516LD(1)-516LD(3) may include one or more of doping the 2D slabs 510P(1)-510P(3) with the lower source/drain material 521L, growing the lower source/drain material 521L epitaxially on the 2D slabs 510P(1)-510P(3), and depositing the lower source/drain material 521L on or in contact with the 2D slabs 510P(1)-510P(3). As shown in FIG. 5A, the lower source/drain material 521L of the lower source/drain region 514LS and the lower drain/source region 514LD may be formed on faces of the 2D slabs 510P(1)-510P(3), except where the first 2D slab 510P(1) is in contact with the isolation layer 507L. For example, the lower source/drain material 521L may be formed on top face 520LT, bottom face 520LB, side face 520LS, and end faces 520LE of 2D slab 510P(2) in the first and second end portions 516LS(2) and 516LD(2). The lower source/drain material 521L may be similarly formed on faces of 2D slabs 510P(1) and 510P(3), as shown in FIG. 5A.

By vertically stacking the 2D slabs 510N(1)-510N(3) such that their longitudinal axes $A5_L(1)$-$A5_L(3)$ overlap, as discussed above, a current flow in the each of the 2D slabs 510N(1)-510N(3) may be controlled by a single gate structure. In this regard, the lower channel structure 506L includes a lower gate 522L disposed on faces of the 2D slabs 510P(1)-510P(3), such as the faces 520LT, 520LB and 520LS of the second 2D slab 510P(2). The lower gate 522L is disposed on the 2D slabs 510P(1)-510P(3) between the lower source/drain region 514LS and the lower drain/source region 514LD in the X-axis direction. The lower gate 522L is separated from the lower source/drain region 514LS by side spacer 524LS and separated from the lower drain/source region 514LD by side spacer 524LD. The lower gate 522L includes gate portions 525L electrically insulated from the respective 2D slabs 510P(1)-510P(3) by gate dielectric layers 526L. The lower gate 522L also includes a lower field gate 527L not shown in FIG. 5A. The lower circuit layer 502L also includes trench contacts 530LS and 530LD formed above the lower source/drain region 514LS and the lower drain/source region 514LD, respectively. An interlayer dielectric (ILD) 528L surrounds the PFET 504P, the lower field gate 527L, and the trench contacts 530LS and 530LD. The lower field gate 527L and the trench contacts 530LS and 530LD are discussed further with respect to FIG. 5B below.

As noted above, the CFET cell circuit 500 in FIG. 5A also includes the upper circuit layer 502U disposed above the lower circuit layer 502L that includes the PFET 504P to provide a CMOS architecture for the CFET cell circuit 500. The upper circuit layer 502U of the CFET cell circuit 500 will now be discussed. In this regard, the upper circuit layer 502U includes the NFET 504N disposed on the isolation layer 507L. The NFET 504N is formed in an upper channel structure 506U including a third 2D slab 510N(1) vertically integrated with a fourth 2D slab 510N(2). The upper channel structure 506U in FIG. 5A also includes another 2D slab 510N(3) vertically integrated with the third and fourth 2D slabs 510N(1), 510N(2) to increase a drive strength of the NFET 504N. Each of the 2D slabs 510N(1)-510N(3) includes at least one monolayer (not individually shown) of a second 2D semiconductor material 518(2) (e.g., $MX_2$ material), such as an N-type material 518N, extending in the X-axis direction and the Y-axis direction. For example, the N-type material 518N may be molybdenum disulfide ($MoS_2$). By employing 2D materials for the N-type material 518N in the slabs 510N(1)-510N(3), channel control in an upper gate region 508U is improved over a channel region in a channel structure formed of silicon. Therefore, the length $LG_U$ of the upper gate region 508U may be made smaller to reduce a dimension of the CFET cell circuit 500 in the X-axis direction without causing an increase in leakage current in the NFET 504N. The 2D slabs 510N(1)-510N(3) extend along respective longitudinal axes $A5_L(1)$-$A5_L(3)$ in the X-axis direction and may be integrated in the vertical direction one above another.

The upper channel structure 506U also includes an upper source/drain material 521U integrated with first end portions 516US(1)-516US(3) of the 2D slabs 510N(1)-510N(3) to form an upper source/drain region 514US and the upper source/drain material 521U integrated with second end portions 516UD(1)-516UD(3) of the 2D slabs 510N(1)-510N(3) to form an upper drain/source region 514UD. In operation of the NFET 504N, either the upper source/drain region 514US or the upper drain/source region 514UD may function as a source while the other functions as a drain. Integration of the upper source/drain region 514US and the upper drain/source region 514UD with the respective end portions 516US(1)-516US(3) and 516UD(1)-516UD(3) may include one or more of doping the 2D slabs 510N(1)-510N(3) with the upper source/drain material 521U, growing the upper source/drain material 521U epitaxially on the 2D slabs 510N(1)-510N(3), and depositing the upper source/drain material 521U on or in contact with the 2D slabs 510N(1)-510N(3). As shown in FIG. 5A, the upper source/drain material 521U of the upper source/drain region 514US and the upper drain/source region 514UD may be formed on faces of the 2D slabs 510N(1)-510N(3), except where the 2D slab 510N(1) is in contact with the isolation layer 507U. For example, the upper source/drain material 521U may be formed on faces of the 2D slab 510N(2) in the end portions 516US(2) and 516UD(2). The upper source/drain material 521U may be similarly formed on faces of 2D slabs 510N(1) and 510N(3), as shown in FIG. 5A.

The upper channel structure 506U also includes an upper gate 522U disposed on faces of the 2D slabs 510N(1)-510N(3). The upper gate 522U is disposed on the 2D slabs 510N(1)-510N(3) between the upper source/drain region 514US and the upper drain/source region 514UD. The upper gate 522U is separated from the upper source/drain region 514US by side spacers 524US and separated from the upper drain/source region 514UD by side spacer 524UD. The upper gate 522U includes gate portions 525U electrically insulated from the respective 2D slabs 510N(1)-510N(3) by gate dielectric layers 526U. The upper gate 522U also includes an upper field gate 527U not shown in FIG. 5A which is a horizontal interconnect disposed on the upper gate 522U. The upper circuit layer 502U includes trench contacts 530US and 530UD disposed above the upper source/drain region 514US and the upper drain/source region 514UD, respectively. The upper circuit layer 502U also includes a trench contact 530UG disposed on the upper gate 522U. Metal layer interconnects $M_{SD}$, $M_G$, and $M_{DS}$ are disposed on the trench contracts 530US, 530UG, and 530UD, respectively, for coupling external circuits to the NFET 504N. An ILD 528U surrounds the NFET 504N, the metal layer interconnects $M_{SD}$, $M_G$, and $M_{DS}$, the upper gate 522U, and the trench contacts 530US and 530UD.

As shown in FIG. 5A, an upper channel column 536U extends vertically (up and down) from a horizontal area of the upper channel structure 506U, and a lower channel column 536L extends vertically from a horizontal area of the lower channel structure 506L. In this regard, the upper channel column 536U overlaps at least a portion of the lower channel column 536L. In the example in FIG. 5A, the upper channel structure 506U in the upper circuit layer 502U overlaps the lower channel structure 506L in the lower circuit layer 502L such that the upper channel column 536U fully overlaps (i.e., occupies substantially the same horizontal area extending in a vertical direction) as the lower channel column 536L. In another aspect, the second 2D slab 510P(2) may partially overlap or fully overlap the first 2D slab 510P(1) when vertically stacked on the first 2D slab 510P(1) to minimize a horizontal area occupied by the lower channel structure 506L, and the second 2D slab 510N(2) may partially overlap or fully overlap the first 2D slab 510N(1) when vertically stacked on the first 2D slab 510N(1) to minimize a horizontal area occupied by the upper channel structure 506U. In this regard, a horizontal area (X-axis and Y-axis directions) occupied by the CFET cell circuit 500 may be reduced in comparison to the standard cell 102 of FIG. 1 in exchange for an increased dimension in the Z-direction.

Figure 5B:
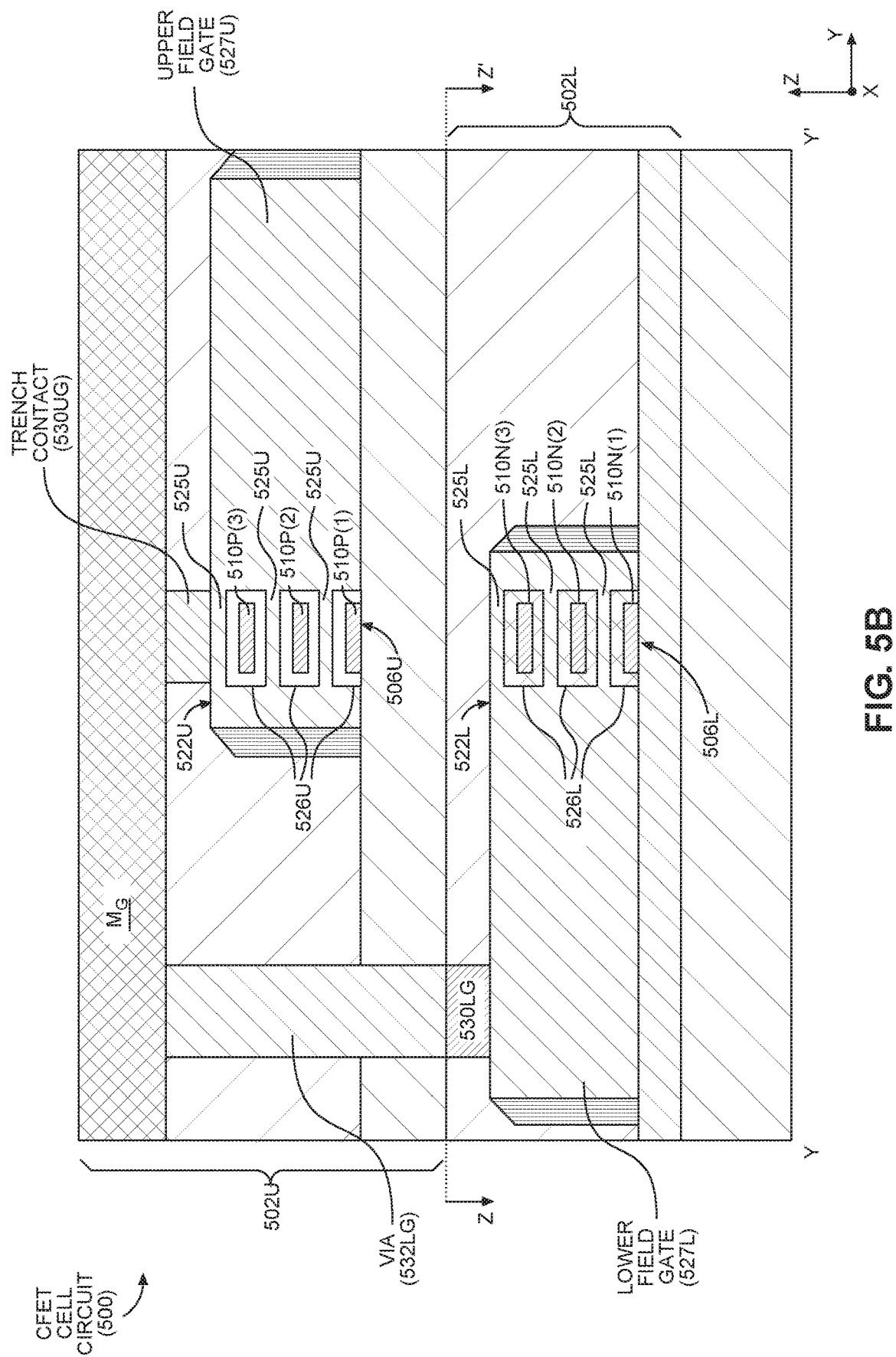
FIG. 5B is a cross-sectional side view of the CFET cell circuit shown in FIG. 5A in a second direction orthogonal to the first direction in FIG. 5A.

FIG. 5B illustrates a side view of a cross-section in the Y-axis and Z-axis directions of the CFET cell circuit 500. The cross-sectional view shown in FIG. 5B is taken along the line Y-Y' shown in the top view of the CFET cell circuit 500 illustrated in FIG. 5D. The cross-sectional view in FIG. 5B shows the 2D slabs 510P(1)-510P(3) one above another in the lower channel structure 506L and the 2D slabs 510N(1)-510N(3) one above another in the upper channel structure 506U. As shown in FIG. 5B, the gate dielectric layers 526L are formed around each of the 2D slabs 510P(1)-510P(3) to separate the 2D slabs 510P(1)-510P(3) from the gate portions 525L of the lower gate 522L. Similarly, the gate dielectric layers 526U are formed around each of the 2D slabs 510N(1)-510N(3) to separate the 2D slabs 510N(1)-510N(3) from the gate portions 525U of the upper gate 522U.

In addition, FIG. 5B shows an example of vertical integration of the upper channel structure 506U in the upper circuit layer 502U above the lower channel structure 506L in the lower circuit layer 502L to reduce a dimension of the CFET cell circuit 500 in the Y-axis direction. For example, the upper channel structure 506U may be positioned directly above the lower channel structure 506L. However, with the lower gate 522L in the lower channel structure 506L located directly below the upper channel structure 506U, a vertical inter-layer access (via) from the lower gate 522L to the metal interconnect $M_G$ may be obstructed. To avoid such obstruction, the lower field gate 527L extends in the Y-axis direction, orthogonal to the longitudinal axes $A5_L(1)$-$A5_L(3)$ of the lower channel structure 506L, from the lower gate 522L to a location in the lower circuit layer 502L that is not vertically obstructed. In this regard, the lower field gate 527L provides a horizontal interconnect from the lower gate 522L to a location in the upper circuit layer 502U in which a via to the metal interconnect $M_G$ is not obstructed by the upper channel structure 506U. An upper field gate 527U may be formed on the upper gate 522U as a horizontal interconnect in the upper circuit layer 502U to an alternative location for the trench contact 530UG, if needed. Referring back to the lower circuit layer 502L in FIG. 5B, a trench contact 530LG is formed on the lower field gate 527L and a via 532LG extends through the upper circuit layer 502U from the trench contact 530LG in the lower circuit layer 502L to the metal interconnect $M_G$ above the upper circuit layer 502U. As will be disclosed with regard to FIGS. 5C-1 and 5C-2, horizontal interconnects extending in the Y-axis direction, similar to the lower field gate 527L, are provided in the lower circuit layer 502L from the lower source/drain region 514LS and the lower drain/source region 514LD to locations at which a via to metal interconnects above the upper circuit layer 502U may not be obstructed by the upper channel structure 506U.

Figures 1, 2, 5C:
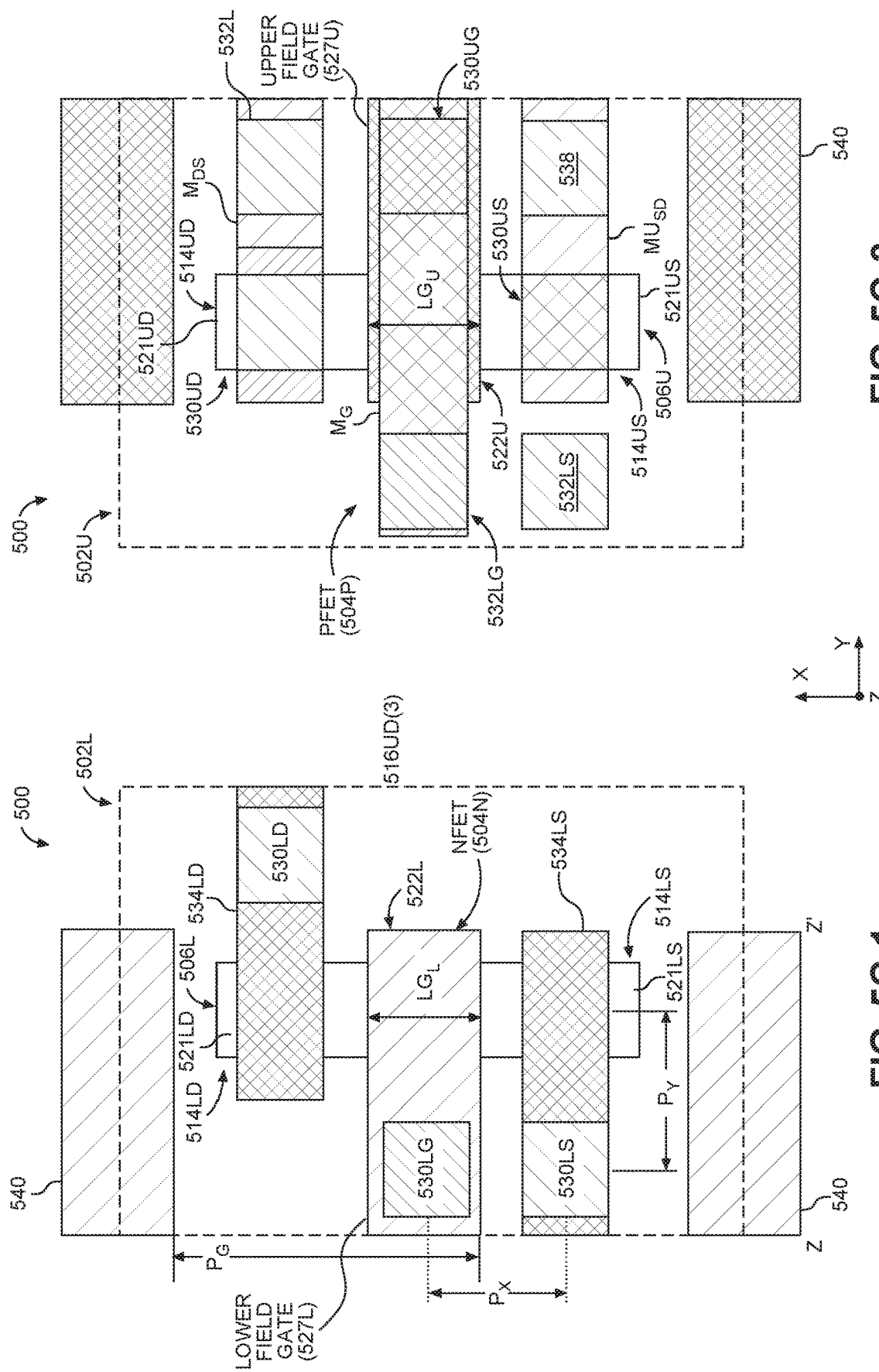

FIG. 5C-1 illustrates a top view of a horizontal cross-section, taken at line Z-Z' in FIG. 5B, showing features of the lower circuit layer 502L including the PFET 504P. FIG. 5C-1 shows horizontal interconnects 534LS and 534LD extending in the X-axis direction, orthogonal to the lower channel structure 506L, from the lower source/drain region 514LS and the lower drain/source region 514LD, respectively. The lower field gate 527L is also shown extending in the Y-axis direction from the lower gate 522L. In addition, FIG. 5C-1 shows that the trench contacts 530LS, 530LG, and 530LD are in locations of the lower circuit layer 502L that are not vertically obstructed by the upper channel structure 506U in the upper circuit layer 502U. In this regard, FIG. 5C-1 shows that the trench contacts 530LS, 530LG, and 530LD are positioned according to a line pitch $P_Y$ in the Y-axis direction relative to the lower channel structure 506L and according to a line pitch $P_X$ in the X-axis direction relative to the lower field gate 527L. Line pitches $P_X$ and $P_Y$ may be a center-to-center distance between features, as shown in FIG. 5C-1.

FIG. 5C-2 illustrates a top view of features of the upper circuit layer 502U including the NFET 504N. FIG. 5C-2 shows the upper field gate 527U extending in the Y-axis direction orthogonal to the upper channel structure 506U, and the trench contact 530UG in an alternative location to the location shown in FIG. 5B. FIG. 5C-2 shows top views of the via 532LG and vias 532LS and 532LD which are positioned to extend vertically from the trench contacts 530LG, 530LS, and 530LD, respectively, in the lower circuit layer 502L. FIG. 5C-2 also shows top views of the trench contracts 530US, 530UG, and 530UD in the upper circuit layer 502U. As shown, the vias 532LS, 532LG, and 532LD and the trench contacts 530UG, 530US, and 530UD are spaced apart in the upper circuit layer 502U according to the line pitch $P_X$ in the X-axis direction and according to the line pitch $P_Y$ in the Y-axis direction in an arrangement to minimize a footprint of the CFET cell circuit 500.

FIG. 5C-2 shows electrical connections for configuring the PFET 504P and the NFET 504N in a configuration of a CMOS inverter. For example, the metal interconnect $M_G$ connects between the trench contacts 530LG and 530UG to electrically couple the lower gate 522L and the upper gate 522U. The metal interconnect $M_{DS}$ connects between the trench contacts 530LD and 530UD to electrically couple the lower drain/source region 514LD and the upper drain/source region 514UD. The metal interconnect $M_{SD}$ is connected between the trench contact 530LS and a via 538 to electrically couple the upper source/drain region 514US of the NFET 504N to ground (e.g., $V_{SS}$). The via 532LS electrically couples the lower source/drain region 514LS of the PFET 504P to a supply voltage ($V_{DD}$).

FIGS. 5C-1 and 5C-2 also show dummy gates 540 located according to a gate pitch $P_G$ in the X-axis direction relative to the lower field gate 527L and the upper field gate 527U. By employing 2D materials to form the upper channel structure 506U, the length dimension $LG_L$ of the upper gate region 508U of the CFET cell circuit 500 in the X-axis direction may be smaller than a length of a channel region in a silicon channel structure (e.g., fin). By reducing the length dimension $LG_L$, the gate pitch $P_G$ of the CFET standard cell, which determines a dimension of the CFET cell circuit 500 in the X-axis direction, may also be smaller.

FIG. 5D shows a top view of the CFET cell circuit 500 with the upper circuit layer 502U of FIG. 5C-2 disposed above and in horizontal alignment with the lower circuit layer 502L of FIG. 5C-1. FIG. 5D shows the upper channel structure 506U disposed directly above the lower channel structure 506L to reduce a dimension of the CFET cell circuit 500 in the Y-axis direction. To avoid vertical obstruction created by locating the upper channel structure 506U directly above the lower channel structure 506L, the horizontal interconnects 534LS and 534LD and the lower field gate 527L provide unobstructed vertical access locations for the vias 532LS, 532LG, and 532LD to electrically couple the PFET 504P to the NFET 504N and/or an external circuit.

CFET cell circuits including an N-type channel structure in a first circuit layer and P-type channel structure in a second circuit layer, each channel structure formed of stacked elongated slabs of 2D semiconductor material to provide a reduction in the X-axis direction and the Y-axis direction of a horizontal footprint of the CFET cell circuit, as illustrated in any of FIGS. 2A-2D and 5A-5D, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
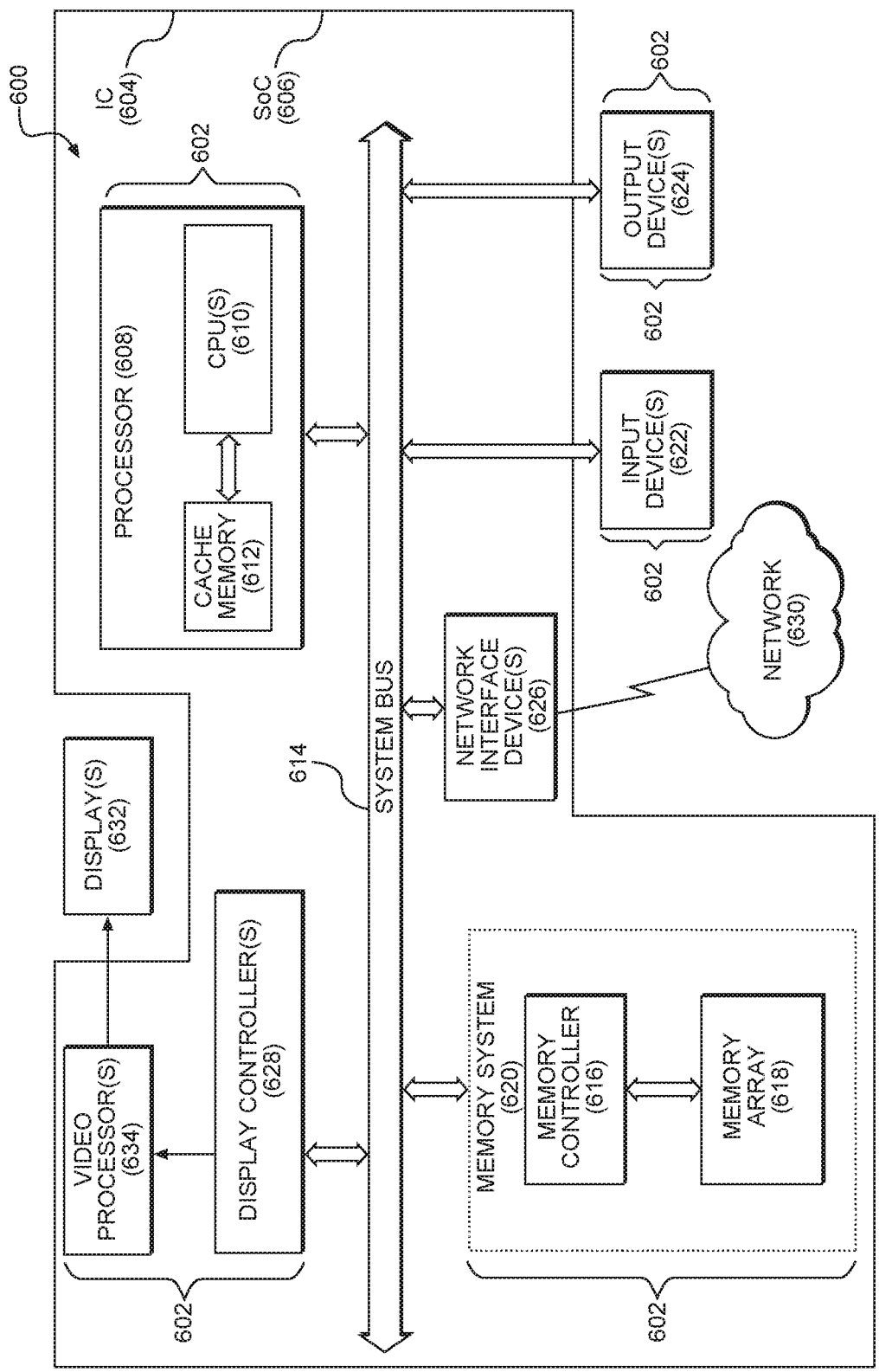
FIG. 6 is a block diagram of an exemplary processor-based system that can include a CFET cell circuit in which a PFET and an NFET are vertically integrated by stacking a second semiconductor layer that includes a second FET above a first semiconductor layer that includes a first FET, such that the channel structure of the second FET is formed above the channel structure of the first FET to reduce a footprint of a CFET cell circuit including, but not limited to, the CFET cell circuits in FIGS. 2A-2D and 5A-5D.

In this regard, FIG. 6 illustrates an example of a processor-based system 600 with circuits 602 that can include CFET cell circuits including an N-type channel structure in a first circuit layer and P-type channel structure in a second circuit layer, each channel structure formed of stacked elongated slabs of 2D semiconductor material to provide a reduction in the X-axis direction and the Y-axis direction of a horizontal footprint of the CFET cell circuit, including, but not limited to, the cell circuits 200 and 500 of FIGS. 2A-2D and 5A-5D, respectively, and according to any aspects disclosed herein. In this example, the processor-based system 600 may be formed as an IC 604 in a system-on-a-chip (SoC) 606. The processor-based system 600 includes a processor 608 that includes one or more central processor units (CPUs) 610, which may also be referred to as CPU or processor cores. The processor 608 may have cache memory 612 coupled to the CPUs 610 for rapid access to temporarily stored data. As an example, the CPUs 610 could include CFET cell circuits including an N-type channel structure in a first circuit layer and P-type channel structure in a second circuit layer, each channel structure formed of stacked elongated slabs of 2D semiconductor material to provide a reduction in the X-axis direction and the Y-axis direction of a horizontal footprint of the CFET cell circuit, including, but not limited to, the cell circuits 200 and 500 of FIGS. 2A-2D and 5A-5D, respectively, and according to any aspects disclosed herein. The processor 608 is coupled to a system bus 614 and can intercouple master and slave devices included in the processor-based system 600. As is well known, the processor 608 communicates with these other devices by exchanging address, control, and data information over the system bus 614. For example, the processor 608 can communicate bus transaction requests to a memory controller 616 as an example of a slave device. Although not illustrated in FIG. 6, multiple system buses 614 could be provided, wherein each system bus 614 constitutes a different fabric.

Other master and slave devices can be connected to the system bus 614. As illustrated in FIG. 6, these devices can include a memory system 620 that includes the memory controller 616 and a memory array(s) 618, one or more input devices 622, one or more output devices 624, one or more network interface devices 626, and one or more display controllers 628, as examples. Each of the memory system 620, the one or more input devices 622, the one or more output devices 624, the one or more network interface devices 626, and the one or more display controllers 628 can include CFET cell circuits including an N-type channel structure in a first circuit layer and P-type channel structure in a second circuit layer, each channel structure formed of stacked elongated slabs of 2D semiconductor material to provide a reduction in the X-axis direction and the Y-axis direction of a horizontal footprint of the CFET cell circuit including, but not limited to, the cell circuits 200 and 500 of FIGS. 2A-2D and 5A-5D, respectively, and according to any aspects disclosed herein. The input device(s) 622 can include any type of input device, including, but not limited to, input keys, switches, voice processors, etc. The output device(s) 624 can include any type of output device, including, but not limited to, audio, video, other visual indicators, etc. The network interface device(s) 626 can be any device configured to allow exchange of data to and from a network 630. The network 630 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 626 can be configured to support any type of communications protocol desired.

The processor 608 may also be configured to access the display controller(s) 628 over the system bus 614 to control information sent to one or more displays 632. The display controller(s) 628 sends information to the display(s) 632 to be displayed via one or more video processors 634, which process the information to be displayed into a format suitable for the display(s) 632. The display(s) 632 can include any type of display, including, but not limited to, a cathode ray tube (CRT), a liquid crystal display (LCD), a plasma display, a light emitting diode (LED) display, etc. The display controller(s) 628, display(s) 632, and/or the video processor(s) 634 can include CFET cell circuits including an N-type channel structure in a first circuit layer and P-type channel structure in a second circuit layer, each channel structure formed of stacked elongated slabs of 2D semiconductor material to provide a reduction in the X-axis direction and the Y-axis direction of a horizontal footprint of the CFET cell circuit, including, but not limited to, the cell circuits 200 and 500 of FIGS. 2A-2D and 5A-5D, respectively, and according to any aspects disclosed herein.

Figure 7:
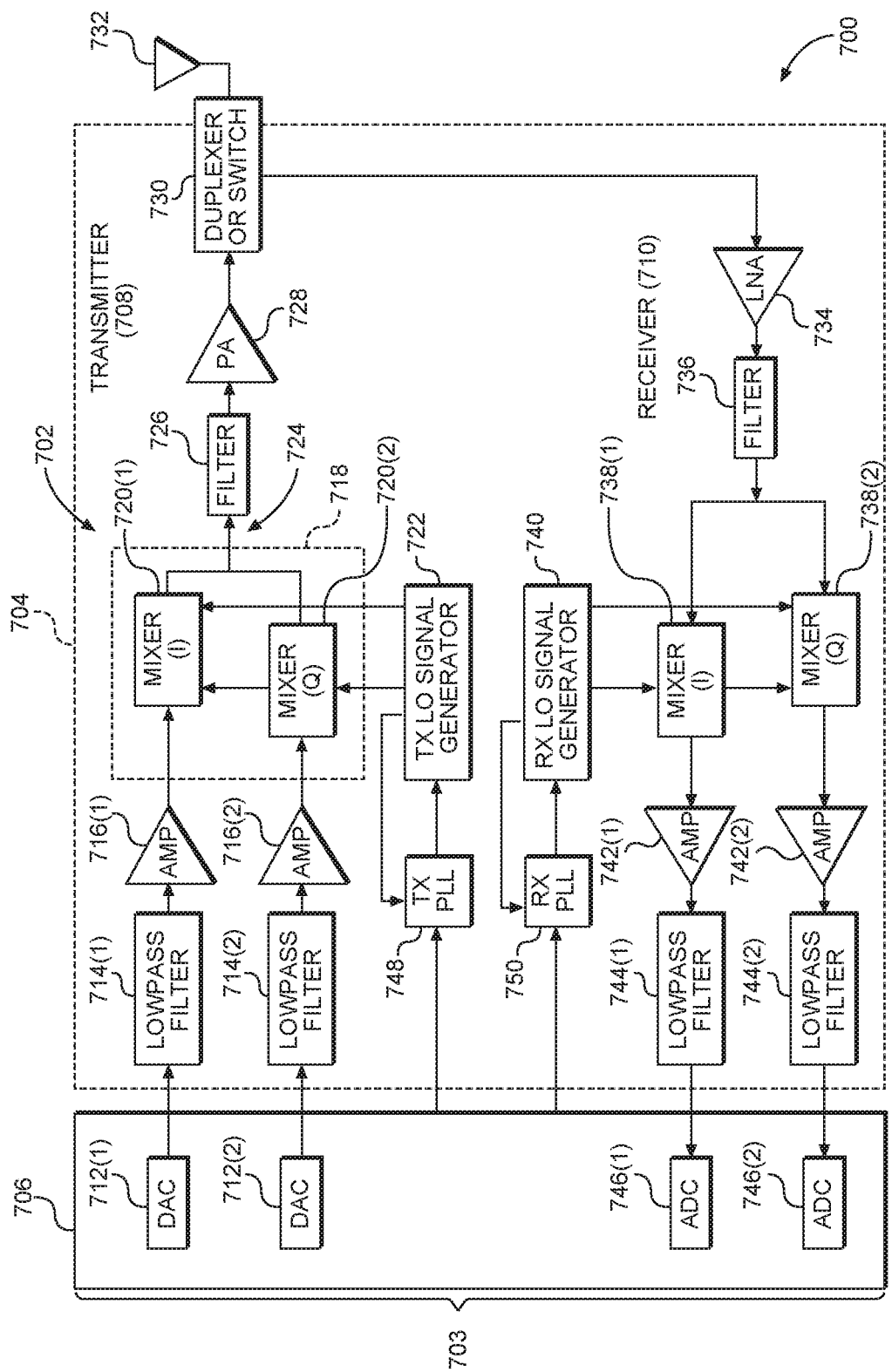
FIG. 7 is a block diagram of an exemplary wireless communications device that includes radio frequency (RF) components formed from an integrated circuit (IC), wherein any of the components therein can include a CFET cell circuit including, but not limited to, the CFET cell circuits in FIGS. 2A-2D and 5A-5D.

FIG. 7 illustrates an exemplary wireless communications device 700 that includes radio frequency (RF) components formed from an IC 702, wherein any of the components therein can include CFET cell circuits including an N-type channel structure in a first circuit layer and P-type channel structure in a second circuit layer, each channel structure formed of stacked elongated slabs of 2D semiconductor material to provide a reduction in the X-axis direction and the Y-axis direction of a horizontal footprint of the CFET cell circuit, including, but not limited to, the cell circuits 200 and 500 of FIGS. 2A-2D and 5A-5D, respectively, and according to any aspects disclosed herein. The wireless communications device 700 may include or be provided in any of the above-referenced devices, as examples. As shown in FIG. 7, the wireless communications device 700 includes a transceiver 704 and a data processor 706. The data processor 706 may include a memory to store data and program codes. The transceiver 704 includes a transmitter 708 and a receiver 710 that support bi-directional communications. In general, the wireless communications device 700 may include any number of transmitters 708 and/or receivers 710 for any number of communication systems and frequency bands. All or a portion of the transceiver 704 may be implemented on one or more analog ICs, RF ICs (RFICs), mixed-signal ICs, etc.

The transmitter 708 or the receiver 710 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 710. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog converters (DACs) 712(1), 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMPs) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired output power level and provides a transmitted RF signal. The transmitted RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by amplifiers (AMPs) 742(1), 742(2) and further filtered by lowpass filters 744(1), 744(2) to obtain I and Q analog input signals, which are provided to the data processor 706. In this example, the data processor 706 includes Analog to Digital Converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked loop (PLL) circuit 748 receives timing information from the data processor 706 and generates a control signal used to adjust the frequency and/or phase of the TX LO signals from the TX LO signal generator 722. Similarly, an RX PLL circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A Complementary Field-Effect Transistor (FET) (CFET) cell circuit, comprising:
  a substrate;
  a lower circuit layer disposed above the substrate, the lower circuit layer comprising:
    a lower channel structure comprising:
      a first two-dimensional (2D) slab vertically integrated with a second 2D slab, the first and second 2D slabs each having a longitudinal axis in a first direction and comprising a semiconductor material of a first type;
      a lower source/drain region integrated with first end portions of the first and second 2D slabs; and
      a lower drain/source region integrated with second end portions of the first and second 2D slabs; and
    a lower gate disposed on the first and second 2D slabs between the lower source/drain region and the lower drain/source region; and
  an upper circuit layer disposed above the lower circuit layer, comprising:
    an upper channel structure comprising:
      a third 2D slab vertically integrated with a fourth 2D slab, the third and fourth 2D slabs each having a longitudinal axis in a second direction and comprising a semiconductor material of a second type;
      an upper source/drain region integrated with first end portions of the third and fourth 2D slabs; and
      an upper drain/source region integrated with second end portions of the third and fourth 2D slabs; and an upper gate disposed on the third and fourth 2D slabs between the upper source/drain region and the upper drain/source region.

2. The CFET cell circuit of claim 1, wherein the semiconductor material of the first type and the semiconductor material of the second type comprise a transition metal dichalcogenide ($MX_2$) material.

3. The CFET cell circuit of claim 1, wherein:
the semiconductor material of the first type comprises one of an N-type and a P-type semiconductor material; and
the semiconductor material of the second type comprises one of the P-type and the N-type semiconductor material opposite to the first type.

4. The CFET cell circuit of claim 3, wherein the N-type semiconductor material comprises tungsten disulfide ($WS_2$) and the P-type semiconductor material comprises molybdenum disulfide ($MoS_2$).

5. The CFET cell circuit of claim 2, wherein each of the first 2D slab and the second 2D slab comprises between one (1) and four (4) monolayers each extending in the first direction and in the second direction orthogonal to the first direction, and the monolayers are stacked in a third direction orthogonal to the first direction and the second direction.

6. The CFET cell circuit of claim 5, wherein:
the lower source/drain region and the lower drain/source region comprise the semiconductor material of the first type formed on the first and second end portions, respectively, of the first and second 2D slabs; and
the upper source/drain region and the upper drain/source region comprise the semiconductor material of the second type formed on the first and second end portions, respectively, of the third and fourth 2D slabs.

7. The CFET cell circuit of claim 6, wherein:
the lower source/drain region and the lower drain/source region comprise the semiconductor material of the first type epitaxially grown on the first and second end portions, respectively, of the first and second 2D slabs; and
the upper source/drain region and the upper drain/source region comprise the semiconductor material of the second type epitaxially grown on the first and second end portions, respectively, of the third and fourth 2D slabs.

8. The CFET cell circuit of claim 5, wherein:
the lower channel structure further comprises the first 2D slab stacked directly above the second 2D slab; and
the upper channel structure further comprises the third 2D slab stacked directly above the fourth 2D slab.

9. The CFET cell circuit of claim 8, wherein the lower channel structure is stacked directly below the upper channel structure.

10. The CFET cell circuit of claim 9, wherein the first direction and the second direction are in a same direction.

11. The CFET cell circuit of claim 2, wherein each of the lower circuit layer and the upper circuit layer comprises a gate-all-around FET (GAA FET).

12. The CFET cell circuit of claim 1, wherein:
the lower circuit layer further comprises a lower channel column of the lower channel structure; and
the upper circuit layer further comprises an upper channel column of the upper channel structure, the upper channel structure overlapping the lower channel structure such that at least a portion of the upper channel column of the upper channel structure overlaps at least a portion of the lower channel column of the lower channel structure.

13. The CFET cell circuit of claim 12, wherein the lower circuit layer further comprises:
at least one first horizontal interconnect having a longitudinal axis orthogonal to the first direction, the at least one first horizontal interconnect coupled to at least one of the lower source/drain region, the lower drain/source region, and the lower gate.

14. The CFET cell circuit of claim 13, wherein:
the lower circuit layer further comprises:
at least one trench contact outside of the upper channel column of the upper channel structure and in contact with the at least one first horizontal interconnect.

15. The CFET cell circuit of claim 12, wherein:
the upper channel column of the upper channel structure fully overlaps the lower channel column of the lower channel structure.

16. The CFET cell circuit of claim 1 integrated in an integrated circuit (IC).

17. The CFET cell circuit of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. A method of fabricating a Complementary Field-Effect Transistor (CFET) cell circuit, comprising:
forming a lower circuit layer above a substrate, comprising:
vertically stacking a first two-dimensional (2D) slab and a second 2D slab to form a lower channel structure, the first and second 2D slabs each having a longitudinal axis in a first direction and comprising a semiconductor material of a first type;
disposing a lower gate on the first and second 2D slabs between first end portions and second end portions of the first and second 2D slabs; and
integrating a lower source/drain material with the first end portions of the first and second 2D slabs to form a lower source/drain region on a first side of the lower gate, and integrating a lower drain/source material with the second end portions of the first and second 2D slabs to form a lower drain/source region on a second side of the lower gate; and
forming an upper circuit layer above the lower circuit layer, comprising:
vertically stacking a third 2D slab and a fourth 2D slab to form an upper channel structure, the third and fourth 2D slabs each having a longitudinal axis in a second direction and comprising a semiconductor material of a second type;
disposing an upper gate on the third and fourth 2D slabs between first end portions and second end portions of the third and fourth 2D slabs; and
integrating an upper source/drain material with the first end portions of the third and fourth 2D slabs to form an upper source/drain region on a first side of the upper gate, and integrating an upper drain/source material with the second end portions of the third and fourth 2D slabs to form an upper drain/source region on a second side of the upper gate.

19. The method of claim 18, wherein:
vertically stacking the first 2D slab and the second 2D slab to form the lower channel structure further comprises:
  forming one or more layers of the semiconductor material of the first type to form the first 2D slab above the substrate;
  forming a lower oxide layer on the first 2D slab; and
  forming one or more layers of the semiconductor material of the first type on the lower oxide layer to form the second 2D slab; and
vertically stacking the third 2D slab and the fourth 2D slab to form the upper channel structure further comprises:
  forming one or more layers of the semiconductor material of the second type to form the third 2D slab above the lower circuit layer;
  forming an upper oxide layer on the third 2D slab; and
  forming one or more layers of the semiconductor material of the second type on the upper oxide layer to form the fourth 2D slab.

20. The method of claim 19, wherein:
disposing the lower gate further comprises:
  forming a lower dummy gate on a lower gate region;
  removing the lower oxide layer in the first and second end portions of the first and second 2D slabs;
  forming an inter-layer dielectric (ILD) in the first and second end portions of the first and second 2D slabs;
  removing the lower dummy gate;
  removing the lower oxide layer between the first and second end portions of the first and second 2D slabs;
  forming lower gate dielectric layers on faces of the first and second 2D slabs between the first and second end portions; and
  forming a conductive gate material over the lower gate dielectric layers; and
disposing the upper gate further comprises:
  forming an upper dummy gate on an upper gate region;
  removing the upper oxide layer in the first and second end portions of the third and fourth 2D slabs;
  forming an ILD in the first and second end portions of the third and fourth 2D slabs;
  removing the upper dummy gate;
  removing the upper oxide layer between the first and second end portions of the third and fourth 2D slabs;
  forming upper gate dielectric layers on faces of the third and fourth 2D slabs between the first and second end portions; and
  forming a conductive gate material over the upper gate dielectric layers.

21. The method of claim 20, wherein:
integrating the lower source/drain material with the first end portions of the first and second 2D slabs and integrating the lower drain/source material with the second end portions of the first and second 2D slabs further comprise:
  removing the ILD in the first and second end portions of the first and second 2D slabs;
  forming the lower source/drain material on the first end portions of the first and second 2D slabs; and
  forming the lower drain/source material on the second end portions of the first and second 2D slabs; and
integrating the upper source/drain material with the first end portions of the third and fourth 2D slabs and integrating the upper drain/source material with the second end portions of the third and fourth 2D slabs further comprise:
  removing the ILD in the first and second end portions of the third and fourth 2D slabs;
  forming the upper source/drain material on the first end portions of the third and fourth 2D slabs; and
  forming the upper drain/source material on the second end portions of the third and fourth 2D slabs.

22. The method of claim 21, wherein:
forming the lower source/drain material on the first end portions of the first and second 2D slabs and forming the lower drain/source material on the second end portions of the first and second 2D slabs each further comprise growing epitaxial layers of the semiconductor material of the first type on the first and second 2D slabs; and
forming the upper source/drain material on the first end portions of the third and fourth 2D slabs and forming the upper drain/source material on the second end portions of the third and fourth 2D slabs each further comprise growing epitaxial layers of the semiconductor material of the second type on the third and fourth 2D slabs.

23. The method of claim 1, wherein vertically stacking the first 2D slab and the second 2D slab comprising the semiconductor material of the first type and vertically stacking the third 2D slab and the fourth 2D slab comprising the semiconductor material of the second type each further comprise vertically stacking 2D slabs comprising a transition metal dichalcogenide ($MX_2$) material.

24. The method of claim 18, wherein:
vertically stacking the first 2D slab and the second 2D slab comprising the semiconductor material of the first type further comprises vertically stacking the first 2D slab and the second 2D slab comprising one of an N-type and a P-type semiconductor material; and
vertically stacking the third 2D slab and the fourth 2D slab comprising the semiconductor material of the second type further comprises vertically stacking the third 2D slab and the fourth 2D slab comprising one of the P-type and the N-type semiconductor material opposite to the first type.

25. The method of claim 24, wherein the N-type semiconductor material comprises tungsten disulfide ($WS_2$) and the P-type semiconductor material comprises molybdenum disulfide ($MoS_2$).

26. The method of claim 23, wherein vertically stacking the 2D slabs comprising the transition metal dichalcogenide ($MX_2$) material comprises vertically stacking from one (1) to four (4) monolayers each disposed in an X-axis and Y-axis direction, and vertically stacking the monolayers in a Z-axis direction.

27. The method of claim 18, further comprising forming at least one horizontal interconnect having a longitudinal axis orthogonal to the first direction, the at least one horizontal interconnect coupled to at least one of the lower source/drain region, the lower drain/source region, and the lower gate.

28. The method of claim 18, wherein the first direction and the second direction are in a same direction.

* * * * *